United States Patent
Simsek-Ege et al.

(10) Patent No.: US 11,908,932 B2
(45) Date of Patent: Feb. 20, 2024

(54) APPARATUSES COMPRISING VERTICAL TRANSISTORS HAVING GATE ELECTRODES AT LEAST PARTIALLY RECESSED WITHIN CHANNEL REGIONS, AND RELATED METHODS AND SYSTEMS

(71) Applicant: Micron Technology, Inc., Boise, ID (US)

(72) Inventors: Fatma Arzum Simsek-Ege, Boise, ID (US); Kevin J. Torek, Meridian, ID (US); Kamal M. Karda, Boise, ID (US); Yunfei Gao, Boise, ID (US); Kamal K. Muthukrishnan, Boise, ID (US)

(73) Assignee: Micron Technology, Inc., Boise, UT (US)

(*) Notice: Subject to any disclaimer, the term of this patent is extended or adjusted under 35 U.S.C. 154(b) by 111 days.

(21) Appl. No.: 16/936,983

(22) Filed: Jul. 23, 2020

(65) Prior Publication Data
US 2022/0029015 A1    Jan. 27, 2022

(51) Int. Cl.
*H01L 29/78* (2006.01)
*H01L 29/10* (2006.01)
(Continued)

(52) U.S. Cl.
CPC ........ *H01L 29/7827* (2013.01); *H01L 21/764* (2013.01); *H01L 21/823481* (2013.01); *H01L 21/823487* (2013.01); *H01L 27/088* (2013.01); *H01L 29/0649* (2013.01); *H01L 29/1037* (2013.01); *H01L 29/66666* (2013.01)

(58) Field of Classification Search
CPC ........... H01L 29/7827; H01L 29/66666; H01L 29/0649; H01L 29/0659; H01L 29/1037; H01L 27/088; H01L 27/092; H01L 27/1104; H01L 27/11556; H01L 27/11582; H01L 21/823487; H01L 21/823481; H01L 21/823885; H01L 21/764; H01L 29/66787; H01L 29/78642

See application file for complete search history.

(56) References Cited

U.S. PATENT DOCUMENTS 9,786,784 B1 * 10/2017 Song ................... H01L 29/785
10,475,923 B1 * 11/2019 Cheng ............. H01L 21/823418
(Continued)

FOREIGN PATENT DOCUMENTS

CN          101814492 A        8/2010

OTHER PUBLICATIONS

Chinese First Office Action for Chinese Application No. 202110776401. 6, dated Oct. 28, 2023, 34 pages with translation.

*Primary Examiner* — Michael M Trinh
(74) *Attorney, Agent, or Firm* — TraskBritt

(57) ABSTRACT

An apparatus includes at least one vertical transistor having a channel region. The channel region includes an upper region having a first width and a lower region below the upper region and having a second width smaller than the first width. The upper region defines at least one overhang portion extending laterally beyond the lower region. The at least one vertical transistor further includes gate electrodes at least partially vertically beneath the at least one overhang portion of the upper region of the channel region. Additional apparatuses and related systems and methods are also disclosed.

25 Claims, 12 Drawing Sheets

(51) Int. Cl.
    *H01L 27/088*     (2006.01)
    *H01L 21/8234*     (2006.01)
    *H01L 29/06*     (2006.01)
    *H01L 21/764*     (2006.01)
    *H01L 29/66*     (2006.01)

(56) References Cited

U.S. PATENT DOCUMENTS

| | | | |
|---|---|---|---|
| 10,714,400 B2* | 7/2020 | Torek | H01L 29/66742 |
| 2011/0079836 A1* | 4/2011 | Lin | H01L 27/10876 257/306 |
| 2013/0134496 A1 | 5/2013 | Ahn et al. | |
| 2017/0317211 A1* | 11/2017 | Kim | H01L 29/66666 |
| 2017/0338334 A1* | 11/2017 | Cheng | H01L 21/7806 |
| 2017/0345927 A1* | 11/2017 | Cantoro | H01L 29/207 |
| 2018/0019164 A1 | 1/2018 | Murray et al. | |
| 2019/0067453 A1 | 2/2019 | Torek | |
| 2019/0273080 A1* | 9/2019 | Surthi | H01L 21/76897 |
| 2020/0251558 A1* | 8/2020 | Hashemi | H01L 29/42356 |

\* cited by examiner

APPARATUSES COMPRISING VERTICAL TRANSISTORS HAVING GATE ELECTRODES AT LEAST PARTIALLY RECESSED WITHIN CHANNEL REGIONS, AND RELATED METHODS AND SYSTEMS

TECHNICAL FIELD

Embodiments disclosed herein relate to apparatuses including vertical transistors, and to related methods. More particularly, embodiments of the disclosure relate to apparatuses including vertical transistors, the vertical transistors including gate electrodes recessed within a channel region of the apparatuses, and to related methods and systems.

BACKGROUND

Fabrication of semiconductor devices includes forming transistors which may be used to access, for example, a storage component of a memory cell of the semiconductor device. The transistors include a channel region formulated and configured to conduct a current responsive to application of a threshold voltage and hinder the flow of current in the absence of the threshold voltage.

In semiconductor devices including vertical memory cells, the transistors associated with the vertical memory cells may be oriented vertically. Forming such transistors includes forming and patterning materials of the transistors of the vertical memory cell, the transistors including source and drain regions, the channel regions, and gate electrodes adjacent to the channel regions. The source and drain regions are formed from source and drain materials, respectively, the channel regions are formed from a channel material, and the gate electrodes are formed from a gate electrode material.

The channel regions of the vertical transistors are formed from a semiconductor material, which is patterned to form pillars of the semiconductor material. However, some semiconductor materials conventionally used in vertical transistors exhibit a high off current ($I_{OFF}$), which may affect charge retention, the flow of current, and other electrical properties of adjacent vertical transistors. For example, a high off current of a vertical transistor may affect (e.g., disturb) the condition of an adjacent vertical transistor when the adjacent vertical transistor is accessed. In conventional vertical transistors, the pillars have sloped sidewalls due to limitations in patterning and etching processes used to form the pillars. The sloped sidewalls result in the pillars exhibiting a smaller critical dimension (CD) of an upper region of the channel region and a larger CD of a lower region of the channel region. The small CD of the upper regions of the channel regions increases the difficulty of forming contacts over the channel regions that are in electrical communication with the gate electrodes. The small CD also increases external timing resistance of the vertical transistors. The large CD of the lower regions of the channel regions reduces a distance (e.g., a wordline to wordline distance) between gate electrodes of adjacent vertical transistors, which results in increased shorting and high parasitic capacitance between the gate electrodes. Additionally, a width of the channel regions laterally adjacent to the gate electrodes is large, which decreases drive efficiency and $I_{ON}$ of the vertical transistors.

DETAILED DESCRIPTION

Figure 1A:
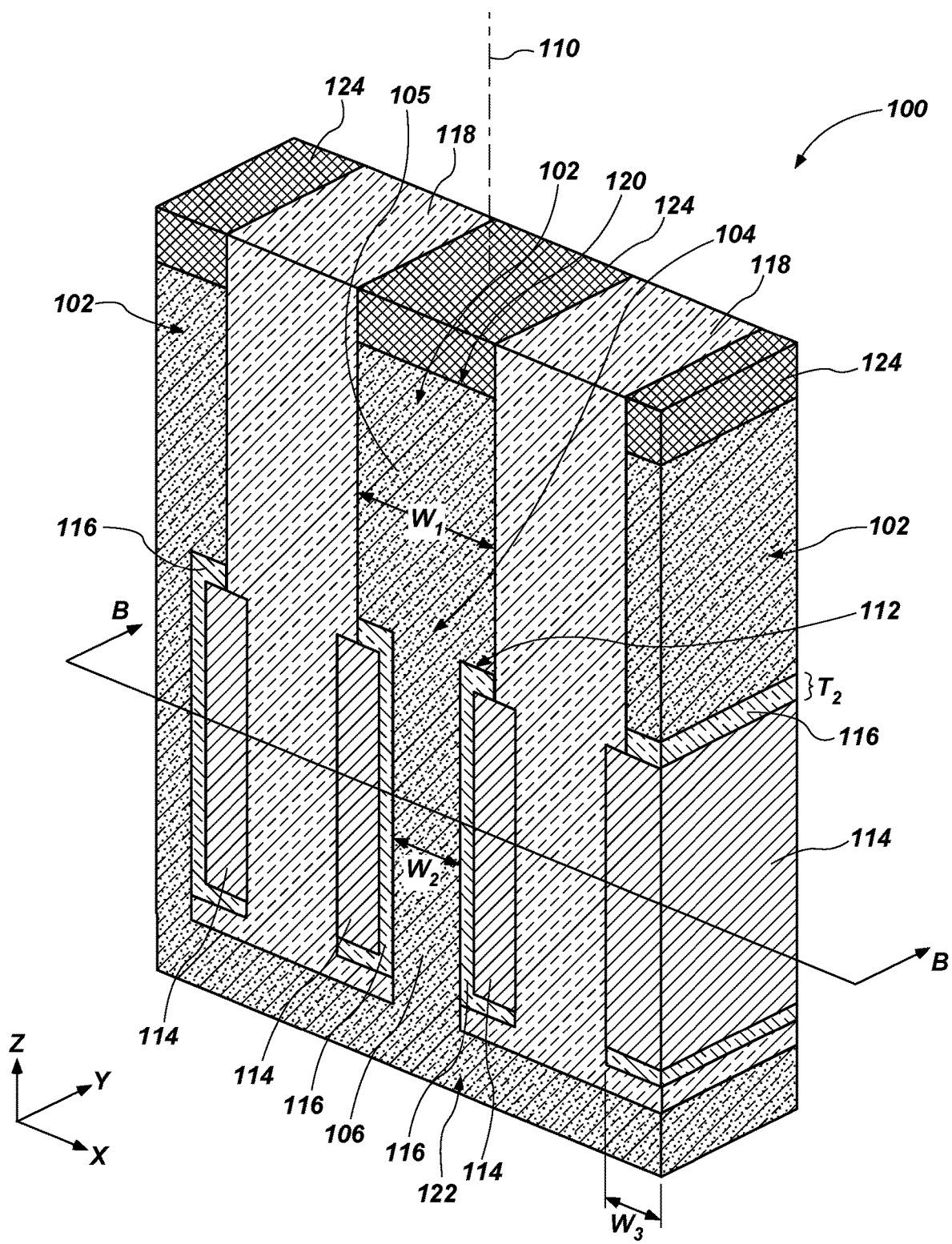
FIG. 1A is a simplified cutaway perspective view of an apparatus including vertical transistors, in accordance with embodiments of the disclosure.

The illustrations included herewith are not meant to be actual views of any particular systems, semiconductor structures, or semiconductor devices, but are merely idealized representations that are employed to describe embodiments herein. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a vertical transistor, a semiconductor device including vertical transistors, or a complete description of a process flow for fabricating such a vertical transistor or a semiconductor device. The structures described below do not form complete semiconductor device structures. Only those process acts and structures necessary to understand the embodiments described herein are described in detail below. Additional acts to form a complete semiconductor device or vertical transistor may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise. Etch chemistries and etch conditions for etching a desired material may be selected by a person of ordinary skill in the art.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "electrically conductive material" means and includes a material including tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

As used herein, the term "apparatus" includes, without limitation, a memory device, as well as semiconductor devices which may or may not incorporate memory, such as a logic device, a processor device, or a radiofrequency (RF) device. Further, an apparatus may incorporate memory in addition to other functions such as, for example, a so-called "system on a chip" (SoC) including a processor and memory, or an apparatus including logic and memory. The apparatus may, for example, be a 3D electronic device, such as a 3D DRAM memory device.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

Embodiments of the disclosure include apparatuses (e.g., electronic devices, microelectronic devices, semiconductor devices, memory devices) having arrays of vertical transistors (e.g., thin film transistors). Each of the vertical transistors includes gate electrodes (e.g., word lines), where at least a portion of the gate electrode is recessed within (e.g., nested within, tucked into) a channel region of the vertical transistor. In particular, the channel region may include an upper region and a lower region where a width of the lower region is narrower relative to the width of the upper region. In some embodiments, the width of lower region may be abruptly narrowed relative to the width of the upper region. As such, an interface between the upper region and the lower portion may define an overhang portion, and the gate electrode may be beneath the overhang portion and adjacent the lower region. A gate dielectric material may be disposed between the gate electrode and the channel region.

Recessing the gate electrode in channel material of the channel region may enable the upper region of the channel material to exhibit a larger cross-sectional area within planes to which a vertical axis of the vertical transistor is normal. As a result, top contact regions of the vertical transistors according to embodiments of the disclosure may be larger relative to the top contact regions of conventional vertical transistors while maintaining or increasing a distance between the gate electrodes (e.g., WL-WL distance) adjacent to the lower region of the channel regions. Providing the larger top contact region may reduce external timing resistance (Rext) and the comparable or increased distance between the gate electrodes in the lower region may increase drive of the vertical transistor. A width of the channel region laterally adjacent to the gate electrodes may also be decreased relative to the width of conventional vertical transistors, which increases the drive efficiency and $I_{ON}$ of the vertical transistors.

Some embodiments of the disclosure further include additional apparatuses having arrays of vertical transistors (e.g., thin film transistors). Each of the vertical transistors may include the gate electrodes (e.g., word lines) recessed within the channel region of the vertical transistor. In particular, the channel region may include the upper region and the lower region where the lower region exhibits a smaller cross-sectional area relative to the upper region. As such, the interface of the upper region and the lower region may define the overhang portion, and the gate electrode may be recessed into the channel material (e.g., nested) beneath the overhang portion and adjacent the lower region. Additionally, the larger cross-sectional area of the upper region within planes to which the vertical axis of the vertical transistor is normal may enable air gaps to be formed between gate electrodes of adjacent channel regions. The air gaps reduce parasitic capacitance between the gate electrodes.

Figure 1B:
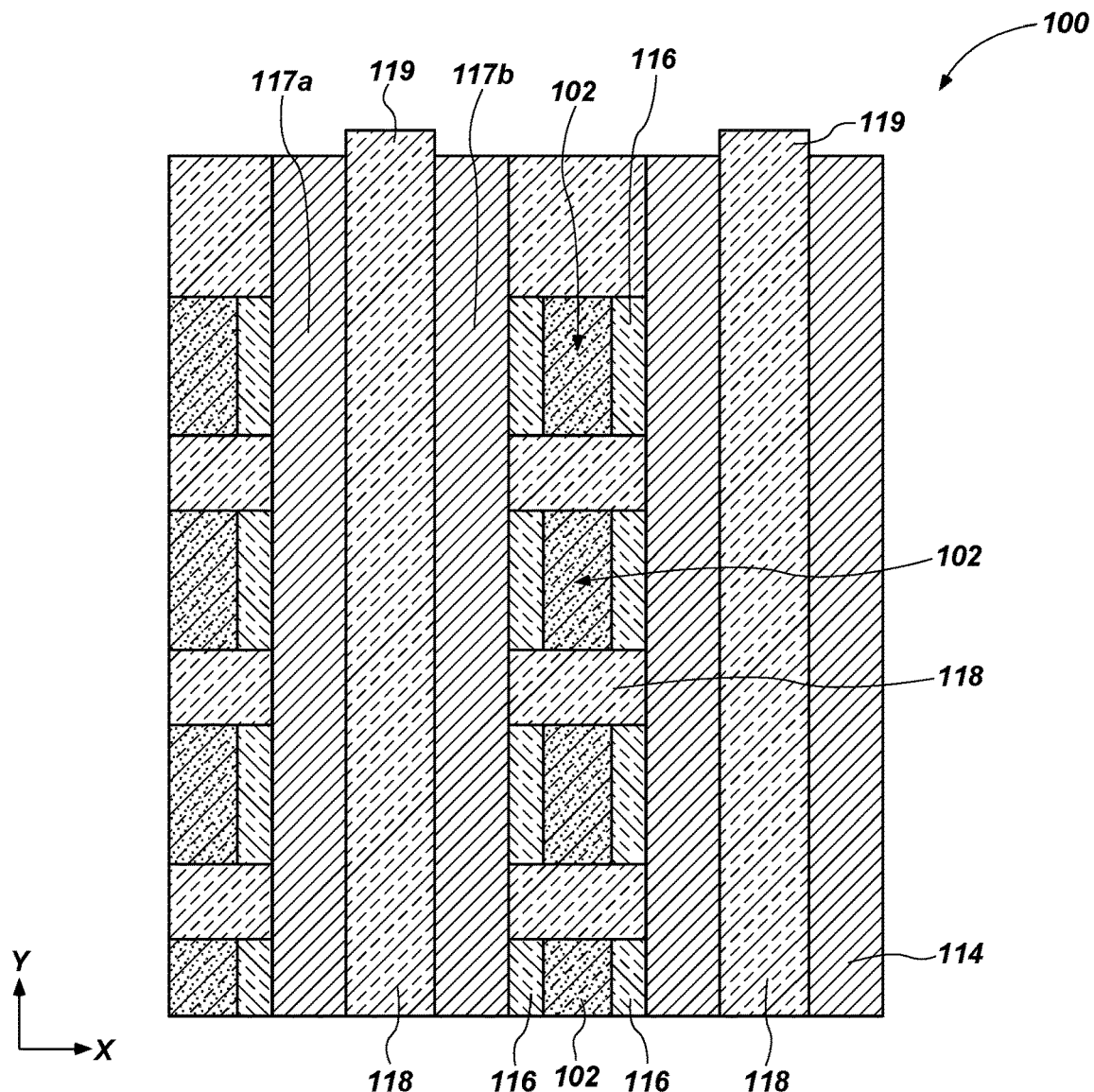
FIG. 1B is a simplified top cross-sectional view of the apparatus of FIG. 1A taken along section line B-B of FIG. 1A.

FIG. 1A is a simplified cross-sectional perspective view of an apparatus 100 (e.g., an electronic device, microelectronic device, semiconductor device, memory device) according to one or more embodiments of the disclosure. FIG. 1B is a simplified planar cross-sectional view of the apparatus 100 of FIG. 1A taken along section line B-B of FIG. 1A.

Referring to FIGS. 1A and 1B together, the apparatus 100 may include vertical transistors 102 (e.g., thin film transistors). Furthermore, while not depicted in FIGS. 1A and 1B, in some embodiments, the vertical transistors 102 may be over a substrate. The substrate may be a base material or a construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

With reference to FIG. 1A and FIG. 1B, the vertical transistors 102 may be arranged in rows (e.g., extending in the x-direction) and columns (e.g., extending in the y-direction). In some embodiments, the rows may be substantially perpendicular to the columns. However, the disclosure is not so limited, and the vertical transistors 102 may be arranged in a pattern different than that illustrated in FIG. 1A and FIG. 1B. Although FIG. 1B illustrates eight vertical transistors 102, the disclosure is not so limited. The apparatus 100 may include, for example, any number of vertical transistors 102, such as more than about 1,000 vertical transistors 102, more than about 10,000 vertical transistors 102, or more than about 100,000 vertical transistors 102.

Each of the vertical transistors 102 may include a respective channel region 104. To facilitate description of the vertical transistors 102, in some instances, reference will be made herein to a single vertical transistor 102 or channel region 104; however, the description of the single vertical transistor 102 or channel region 104 applies to one or more vertical transistors 102 or channel regions 104 of the apparatus 100.

In some embodiments, the channel region 104 may comprise a material formulated and configured to exhibit electrical conductivity responsive to application of a suitable voltage (e.g., a threshold voltage $V_t$) to the vertical transistor 102 (e.g., between the gate electrode (described below)) and a source region. The channel region 104 may include the source region at one end of the channel region 104 and a drain region at an opposite end of the channel region 104. The channel region 104 may be in electrical communication with upper and lower conductive contacts, which in turn may be in direct contact with conductive lines (e.g., data/sense lines, digit lines) of the apparatus 100.

In one or more embodiments, the channel region 104 may include an upper region 105 and a lower region 106 connected to and extending from the upper region 105. In one or more embodiments, sidewalls of the upper region 105 and sidewalls of the lower region 106 may be at least substantially vertical. Since the lower region 106 is narrower relative to the upper region 105 of the channel region 104, the sidewalls of the upper region 105 and the lower region 106 are not coplanar in the z direction. The upper region 105 exhibits a larger width $W_1$ in the x direction in comparison to a width $W_2$ of the lower region 106 of the channel region 104. Therefore, the upper region 105 may have a larger cross-sectional area within the xy plane in comparison to the lower region 106 of the channel region 104. In particular, the lower region 106 may have at least one cross-sectional dimension (e.g., width) within the xy plane that is smaller than the correlating cross-sectional dimension of the upper region 105. Put another way, the upper region 105 may have a first cross-sectional area within a first plane to which a longitudinal axis 110 of the vertical transistor 102 is normal, and the lower region may have a second cross-sectional area within a second plane parallel to the first plane and along the longitudinal axis of the vertical transistor 102. Additionally, the second cross-sectional area of the lower region 106 is smaller than the first cross-sectional area of the upper region 105 of the channel region 104. In some embodiments, the upper region 105 may have a first substantially-consistent cross-sectional area along the longitudinal axis 110 of the vertical transistor 102 (e.g., a longitudinal axis of the channel region 104), and the lower region 106 may have a second substantially-consistent cross-sectional area along the longitudinal axis 110 of the vertical transistor 102.

In some embodiments, a ratio of the cross-sectional area of the lower region 106 of the channel region 104 and the cross-sectional area of the upper region 105 of the channel region 104 within the xy plane is between about 0.25 and about 0.85. In some embodiments, the upper region 105 may project outward radially from a longitudinal axis 110 of the vertical transistor relative to the lower region 106 and may define the overhang portion 112 of the upper region 105. For instance, and interface between the upper region 105 and the lower region 106 may define the overhang portion 112. As is described in greater detail below, having the upper region 105 protrude outward and define the overhang portion 112 may enable gate electrodes 114 (e.g., word lines) to be formed at least partially underneath the overhang portion 112 of the upper region 105. For instance, the portion of the gate electrodes 114 may be at least partially recessed into (e.g., tucked into, nested within) the material of the channel region 104 such that the upper region 105 of the channel region 104 at least partially overhangs the gate electrode 114. In some embodiments, the overhang portion 112 of the upper region 105 may extend over the gate electrode 114 in a direction normal to a surface of the lower region 106 of the channel region 104.

The channel region 104 may include a material formulated to conduct current responsive to application of a suitable voltage (e.g., a threshold voltage, a set bias voltage, a read bias voltage) to the vertical transistor 102. In some embodiments, the channel region 104 may include polycrystalline silicon. In other embodiments, the channel region 104 may include a metal oxide material. In additional embodiments, the channel region 104 may comprise a semiconductive material having a larger bandgap than polycrystalline silicon and may be referred to herein as a so-called "high bandgap material." For example, the channel region 104 may be formed of any conventional channel material. As will be described herein, in some embodiments, the channel region 104 may include a composite structure including one or more discrete portions of one or more of materials or doped regions or the channel region 104 may include on or more gradients transitioning between two more materials or doped regions.

Figure 1C:
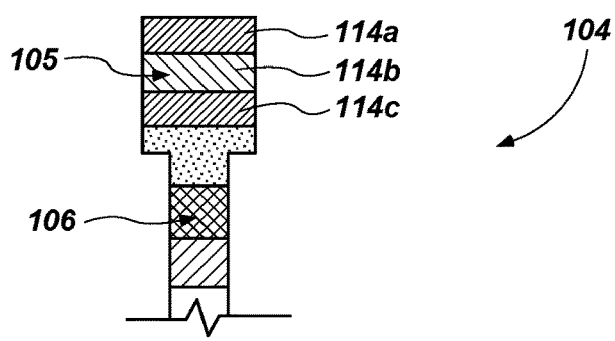
FIG. 1C is a simplified cross-sectional view of a channel region, in accordance with embodiments of the disclosure.

In some embodiments, the channel region 104 comprises a single semiconductor material having a substantially uniform chemical composition. The channel region 104 may, for example, include a homogeneous semiconductor material. In other embodiments, the channel region 104 may be a heterogeneous semiconductor material, such as including two or more materials that differ in chemical composition or two or more portions of a single material that differ in dopant concentration. The channel region 104 may comprise a composite structure including more than one semiconductor material. FIG. 1C is a simplified cross-sectional view of a portion of one of the channel regions 104, showing, for example, the portion of the channel region 104 of FIG. 1A. The channel region 104 may include, for example, a first semiconductor material 114a, a second semiconductor material 114b adjacent to the first semiconductor material 114a, and a third semiconductor material 114c adjacent to the second semiconductor material 114b. The second semiconductor material 114b may be located between the first semiconductor material 114a and the third semiconductor material 114c. The channel region 104 of FIG. 1C may also be referred to herein as a so-called "multilayer" channel region, since the channel region 104 includes more than one semiconductor material (e.g., the first semiconductor material 114a, the second semiconductor material 114b, and the third semiconductor material 114c).

In some embodiments, the first semiconductor material 114a and the third semiconductor material 114c comprise the same material and the second semiconductor material 114b comprises a different material than the first semiconductor material 114a and the third semiconductor material 114c. In other embodiments, each of the first semiconductor material 114a, the second semiconductor material 114b, and the third semiconductor material 114c comprise different materials. In other embodiments, each of the first semiconductor material 114a, the second semiconductor material 114b, and the third semiconductor material 114c comprise the same material but differ in dopant concentration such that the first semiconductor material 114a and the third semiconductor material 114c are configured as source/drain regions of the vertical transistor 102. Although FIG. 1C illustrates that the channel region 104 comprises three distinct semiconductor materials, the disclosure is not so limited. In other embodiments, the channel region 104 comprises two different semiconductor materials, four semiconductor materials, five semiconductor materials, etc. As one example, in some embodiments, the channel region 104 comprises the first semiconductor material 114a and the second semiconductor material 114b adjacent to the first semiconductor material 114a.

Referring still to FIGS. 1A-1C, in some embodiments, the first semiconductor material 114a, the second semiconductor material 114b, and the third semiconductor material 114c of the channel region 104 may have distinct boundaries (e.g., grain boundaries). In other embodiments, the channel region 104 may include one or more gradients transitioning between the materials. For example, a change from the first semiconductor material 114a to the second semiconductor material 114b may be gradual. Likewise, the channel region 104 may include one or more different doped regions, and the boundaries may be distinct or gradual within the channel region 104.

Each vertical transistor 102 may include a pair of gate electrodes 114 surrounded on at least some sides thereof by a gate dielectric material 116. The gate electrode 114 may also be referred to herein as a word line of the vertical transistor 102. With reference to FIG. 1B, the gate electrodes 114 may be configured as lines extending in, for example, the y-direction. In some embodiments, each vertical transistor 102 may include two gate electrodes 114 (e.g., a pair of electrodes) adjacent to the lower region 106 of the channel region 104. For example, each vertical transistor 102 may include a first gate electrode and a second gate electrode, with the first and second gate electrodes on opposing sides of the lower region 106 of the channel region 104 of the vertical transistor 102. Furthermore, the gate dielectric material 116 may adjoin (e.g., abut) the overhang portion 112 of the channel region 104 of the vertical transistor 102. Put another way, a portion of the first and second gate electrodes 114 and respective gate dielectric materials 116, may be recessed into (e.g., nested within) the channel region 104 and may be vertically at least partially beneath the upper region 105 of the channel region 104. In some embodiments, the gate electrode 114 may have a general elongated rectangular cross-section in the xz plane. In other words, each of the first and second gate electrodes may be at least partially recessed within the channel region 104 relative to an outermost surface (e.g., outermost boundary) of the channel region 104 in a direction (e.g., the x-direction) orthogonal to the longitudinal axis 110 of the vertical transistor 102. Nesting the gate electrodes 114 within the channel material is described in greater detail below. The gate electrodes 114 may be laterally adjacent to the lower region 106 of the channel region 104.

Furthermore, in one or more embodiments, the gate dielectric material 116 may be between the gate electrode 114 on at least an upper surface and a lateral side surface of the gate electrode 114. In additional embodiments, the gate dielectric material 116 may be between the gate electrode 114 on three consecutive sides (e.g., at least an upper surface, a lateral side surface, and a lower surface) of the gate electrode 114. For instance, the gate dielectric material 116 may have a general block-C (or mirrored block-C) cross-sectional shape (not shown) within the xz plane. Furthermore, the gate dielectric material 116 may be in contact with a lower surface of the gate electrode 114, a side surface of the gate electrode 114, and a top surface of the gate electrode 114.

The gate electrode 114 may include an electrically conductive material such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

A width $W_3$ of the gate electrode 114 in the x-direction may be between about 30 Å and about 150 Å, while word line pitch may change from about 32 nm to about 48 nm. However, the gate electrode 114 may have any width.

In some embodiments, at least about one-third of an overall width $W_3$ (i.e., thickness) of the gate electrode 114 may be beneath the overhang portion 112 of the upper region 105 of the channel region 104 (e.g., recessed into the channel region). In other words, when viewed from the xy plane depicted in FIG. 1B, at least about one-third of the width $W_3$ overlaps with (e.g., extends into) a cross-section of the upper region 105 of the channel region 104. In further embodiments, at least about one-half of an overall width $W_3$ of the gate electrode 114 may be beneath the overhang portion 112 of the upper region 105 of the channel region 104. In yet further embodiments, at least about two-thirds of an overall width $W_3$ of the gate electrode 114 may be beneath the overhang portion 112 of the upper region 105 of the channel region 104. In further embodiments, an entirety of the width $W_3$ gate electrode 114 may be beneath the overhang portion 112 of the upper region 105 of the channel region 104.

In other words, in some embodiments, a distance by which the gate electrode 114 is recessed within the channel region 104 relative to an outermost surface of the channel region 104 (e.g., an outermost surface of the upper region 105 of the channel region 104) is at least one-third of an overall width of the gate electrode 114 in the direction (e.g., the x-direction) orthogonal to the longitudinal axis 110 of the vertical transistor 102. In one or more embodiments, a distance by which the gate electrode 114 is recessed within the channel region 104 relative to an outermost surface of the channel region 104 (e.g., an outermost surface of the upper region 105 of the channel region 104) is at least one-half of an overall width of the gate electrode 114 in the direction (e.g., the x-direction) orthogonal to the longitudinal axis 110 of the vertical transistor 102. In additional embodiments, a distance by which the gate electrode 114 is recessed within the channel region 104 relative to an outermost surface of the channel region 104 (e.g., an outermost surface of the upper region 105 of the channel region 104) is at least two-thirds of an overall width of the gate electrode 114 in the direction (e.g., the x-direction) orthogonal to the longitudinal axis 110 of the vertical transistor 102. In further embodiments, a distance by which the gate electrode 114 is recessed within the channel region 104 relative to an outermost surface of the channel region 104 (e.g., an outermost surface of the upper region 105 of the channel region 104) is at least an entirety of an overall width of the gate electrode 114 in the direction (e.g., the x-direction) orthogonal to the longitudinal axis 110 of the vertical transistor 102.

As noted above, the gate dielectric material 116 may be disposed around at least some sides of the gate electrode 114. In some embodiments, and with reference to FIG. 1A and FIG. 1B, the gate dielectric material 116 may be located above and below the gate electrode 114 (FIG. 1A) and on one lateral side (e.g., the sides in the x-direction) of the gate electrode 114. For instance, the gate dielectric material 116 may be present on the lateral side of the gate electrode 114 proximal to (e.g., facing) the channel region 104. In other words, the gate dielectric material 116 may be disposed between the gate electrode 114 and the upper region 105 of the channel region 104. As is described in greater detail below, in some embodiments, an electrically insulative material 118, which may comprise the same material as the gate dielectric material 116, may be disposed around at least one other lateral side of the gate electrode 114 (e.g., a lateral side opposite the gate dielectric material 116). Additionally, in one or more embodiments, the electrically insulative material 118 may be disposed around at least one other lateral side of the gate electrodes 114 (e.g., the sides of the gate electrodes 114 in the y-direction). In some such embodiments, the gate electrode 114 may be substantially surrounded on all sides thereof (e.g., above, below, left, right, front, back, etc.) with a dielectric material, such as the gate dielectric material 116 and the electrically insulative material 118.

The gate dielectric material 116 may comprise one or more electrically insulative materials, such as, for example, phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), another material, or combinations thereof. In some embodiments, the gate dielectric material 116 comprises silicon dioxide.

The gate dielectric material 116 may have a thickness $T_2$ between about 30 Å and about 60 Å. In some embodiments, a distance between surfaces of the gate electrode 114 (e.g., an upper surface of the gate electrode 114) and surfaces of the channel regions 104 (e.g., a lower surface of the overhang portion 112 of the channel region 104) may be tailored by adjusting the thickness of the gate dielectric material 116.

As noted above, the apparatus 100 may include electrically conductive contacts 119 (FIG. 1B) in electrical communication with the gate electrodes 114. In some embodiments, each column of the vertical transistors 102 (FIG. 1A) may include at least one electrically conductive contact 119 in electrical communication with the gate electrodes 114 of its corresponding column. The electrically conductive contacts 119 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive contacts 119 comprise the same material as the gate electrodes 114. In other embodiments, the electrically conductive contacts 119 comprise a material different from the material of the gate electrodes 114.

In some embodiments, the electrically conductive contacts 119 are in electrical communication with a voltage source configured to provide a suitable voltage (e.g., a bias voltage) to the gate electrodes 114 associated with the electrically conductive contacts 119. Referring still to FIGS. 1A and 1B, in some embodiments, the apparatus 100 may include an electrically insulative material 118 between adjacent vertical transistors 102.

With reference again to FIG. 1A and FIG. 1B, adjacent vertical transistors 102 may be separated from each other by the electrically insulative material 118. The electrically insulative material 118 may electrically isolate adjacent rows of the vertical transistors 102 and adjacent columns of the vertical transistors 102. Additionally, the insulative material 118 may be disposed between adjacent gate electrodes 117a, 117b. For instance, as noted above, the insulative material 118 may abut a lateral side of a given gate electrode 114, 117a, 117b.

The electrically insulative material 118 may be a dielectric material including, for example, phosphosilicate glass, borosilicate glass, borophosphosilicate glass (BPSG), fluorosilicate glass, silicon dioxide, titanium dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In some embodiments, the insulative material 118 may include a spin-on dielectric. As noted above, in some embodiments, the electrically insulative material 118 comprises the same material as the gate dielectric material 116.

In one or more embodiments, each of the vertical transistor 102 may include an upper contact 120 and a lower contact 122, which are in electrical communication with the gate electrodes 114 and other components of the apparatus 100. As is discussed in greater detail below, the lower contact 122 of the vertical transistor 102 may be in electrical communication with a respective first conductive line. Additionally, in one or more embodiment, the lower contact 122 may include an electrically conductive material. For instance, the lower contact 122 may include the same material as the first conductive lines. In some embodiments, one or more vertical transistor 102 in a given row or within the apparatus 100 may share a lower contact 122. For instance, and as shown in FIG. 1A, the lower contact 122 may be common to one or more of the vertical transistors 102. In some embodiments, the first conductive lines may be arranged in rows extending in a first direction (e.g., the x-direction) along the substrate. In some such embodiments, each of the first conductive lines may be in electrical communication with the vertical transistors 102 of a row of vertical transistors 102. In some embodiments, the first conductive lines may be configured as digit lines (e.g., access lines).

Alternatively, each of the vertical transistors 102 may be in electrical communication with a separate contact located adjacent (e.g., below) each vertical transistor 102. In other words, the lower contact 122 may be configured as multiple portions of a conductive material rather than as a single portion of the conductive material. In embodiments having distinct lower contacts, the electrically insulative material 118 may electrically isolate the lower contact 122 of a given vertical transistor 102 from the lower contacts 122 of adjacent vertical transistors 102. In some embodiments, the first conductive lines may be arranged in rows extending in a first direction (e.g., the x-direction) along the substrate. In some such embodiments, each of the first conductive lines may be in electrical communication with the vertical transistors 102 of a row of vertical transistors 102. In some embodiments, the first conductive lines may be configured as digit lines (e.g., access lines).

The lower contact 122 may be formed of an electrically conductive material including, but not limited to, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the first conductive lines comprise tungsten. In other embodiments, the first conductive lines comprise ruthenium.

The first conductive lines of adjacent rows may be electrically isolated from each other, such as through the electrically insulative material 118, which may comprise, for example, phosphosilicate glass, borosilicate glass, borophosphosilicate glass (BPSG), fluorosilicate glass, silicon dioxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), high-k dielectric materials (e.g., aluminum oxide ($Al_2O_3$), tantalum oxide ($Ta_2O_5$), zirconium oxide ($ZrO_2$), hafnium oxide ($HfO_2$), lanthanum oxide ($La_2O_3$), titanium oxide ($TiO_2$)), another material, or combinations thereof. In some embodiments, the electrically insulative material 118 comprises silicon dioxide.

In some embodiments, the upper contact 120 may include an electrically conductive material. For instance, the upper contact 120 may include the same material as the lower contact 122. In other embodiments, the upper contact 120 may include a different material from the lower contact 122.

The upper contact 120 may at least partially define a second conductive line. As will be understood by one of ordinary skill in the art, the second electrically conductive lines may extend in a second direction (e.g., the y-direction), different from the first direction in which the first electrically conductive lines extend. As discussed above for the lower contact 122, the upper contact 120 may be common to one or more of the vertical transistors 102 and may be configured as a single, continuous conductive material. Alternatively, the upper contact 120 may be in electrical communication with a separate contact located adjacent (e.g., above) each vertical transistor 102 such that the upper contact 120 is configured as multiple, discrete portions of conductive material. The second electrically conductive lines may include an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the second electrically conductive lines comprise tungsten or ruthenium. In some embodiments, the second electrically conductive lines comprise the same materials as the first electrically conductive lines. In other embodiments, the second conductive lines comprise a different material than the first conductive lines.

Referring still to FIGS. 1A-1C, each vertical transistor 102 may include a hard mask material 124 over a top surface of the channel region 104 of the vertical transistor 102. In one or more embodiments, as noted above, the hard mask material 124 may be an upper contact 120 of the vertical transistor 102. In some embodiments, the hard mask material 124 may include one or more of, titanium, TiN, or TaN. In other embodiments, the hard mask material 124 is a dielectric material. Furthermore, in some embodiments, the hard mask material 124 may include any of the materials described above in regard to the upper and lower contacts 120, 122 and first and second electrically conductive lines.

Referring to FIGS. 1A-1C together, the apparatus 100 and vertical transistor 102 of the disclosure may provide advantages over conventional vertical transistors. For instance, because the portion of the gate electrodes 114 is recessed within the channel region 104 of the vertical transistor 102, the upper region 105 may be formed at a larger cross-sectional area than contact regions of conventional vertical transistors, while maintaining and/or increasing a distance between gate electrodes (e.g., WL-WL distance) of adjacent vertical transistors 102. Furthermore, because the upper region 105 has a larger cross-sectional area than conventional vertical transistors, the vertical transistors 102 according to embodiments of the disclosure may reduce external timing resistance (Rext). The smaller cross-sectional area of the lower region 106, due to the gate electrodes 114 being recessed within the channel region 104, also reduces external timing resistance (Rext) of the vertical transistor 102 without affecting a distance between gate electrodes 114 (e.g., WL-WL distance) of adjacent vertical transistors 102. The lower region 106 of the channel region 104 also exhibits a smaller width laterally adjacent to the gate electrodes 114 compared to the corresponding width of conventional vertical transistors. By exhibiting a small channel width in the lower region 106, the vertical transistor 102 exhibits a low $I_{off}$ and a high $I_{on}$. Since the lower region 106 of the channel region 104 has a smaller width than the upper region 105 of the channel region 104, the drive of the apparatus may be maintained or increased without decreasing the cross-sectional surface area of the upper region 105.

Furthermore, by nesting the gate electrodes 114 within the channel region 104 and creating a lower region 106 of the vertical transistor 102 to have a smaller cross-sectional area, the vertical transistor 102 of the disclosure improves drive within the vertical transistor 102 in comparison to conventional vertical transistors. Moreover, the vertical transistors of the disclosure improve $I_{ON/OFF}$ functionality of the vertical transistors. Furthermore, the apparatus 100 of the disclosure may improve parasitic capacitance between gate electrodes 114 (i.e., word lines). The foregoing advantages also result in apparatuses having improved yield and performance.

Figure 2A:
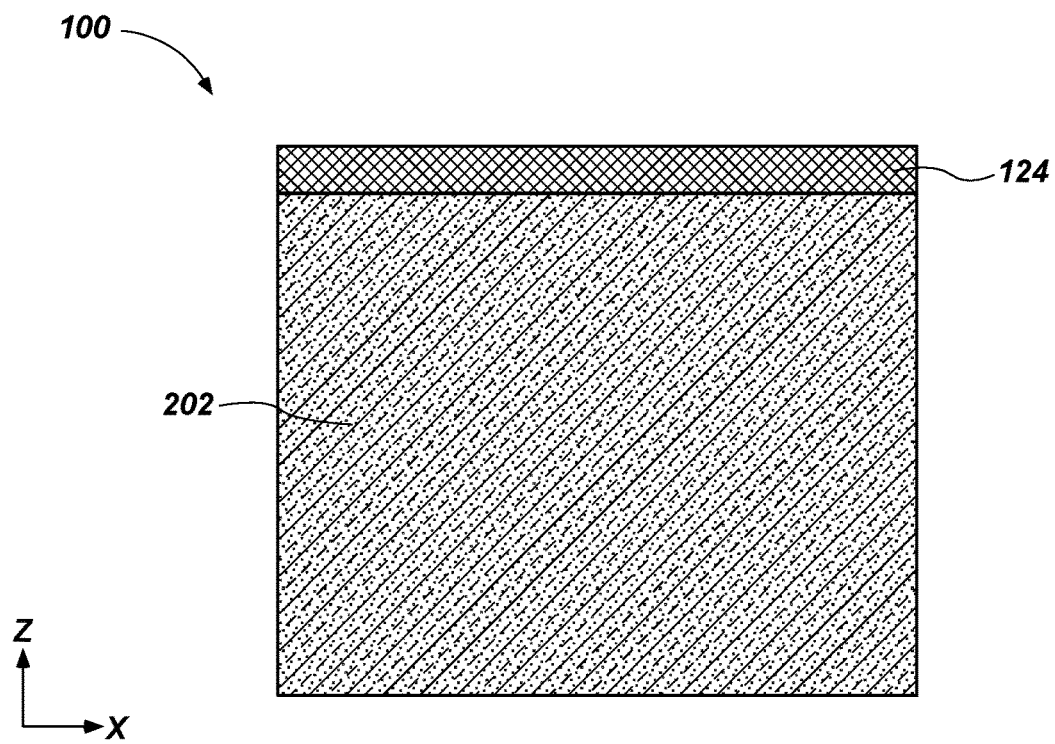
FIGS. 2A-2J illustrate a method of forming the apparatus, in accordance with embodiments of the disclosure.

FIGS. 2A-2J show a method, according to embodiments of the disclosure, of forming an apparatus 100 (e.g., electronic device, microelectronic device, semiconductor device, memory device) as described above with reference to FIGS. 1A-1C. FIG. 2A is a simplified cross-sectional view of an apparatus 100. In some embodiments, the method may include forming a hard mask material 124 over an upper surface of a channel material 202, as shown in FIG. 2A. In one or more embodiments, the hard mask material 124 may be formed over the channel material 202 via one or more of atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof.

The hard mask material 124 and the channel material 202 may include any of the materials described above in regard to the hard mask material 124 and channel regions 104 of FIGS. 1A-1C. Moreover, the channel material 202 may include one or more channel materials, dopant gradients, and/or multiple regions discussed above in regard to FIGS. 1A-1C.

Figure 2B:
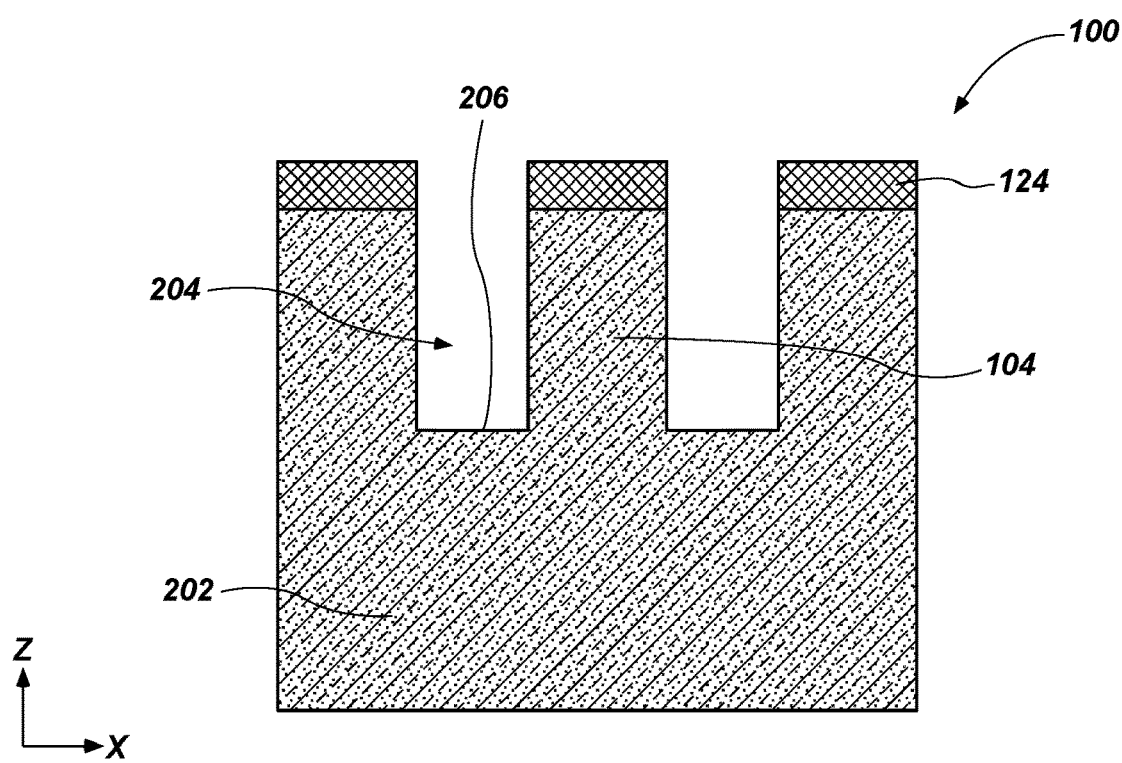

With reference to FIG. 2B, the method may include removing (e.g., etching) a portion of the hard mask material 124 and the channel material 202 to form a patterned hard mask material 124 and channel material 202. For instance, the hard mask material 124 and the channel material 202 may be patterned to remove portions of the channel material 202 and form trenches 204 and channel regions 104 at a desired pitch, width, and spacing within the channel material 202. The portions of the hard mask material 124 and the channel material 202 may be removed via an anisotropic etch process, such as an anisotropic dry or wet etch process. By way of non-limiting example, the hard mask material 124 and the channel material 202 may be patterned by reactive ion etching (RIE), plasma etching, another etching method, etc. In particular, portions of the hard mask material 124 and the channel material 202 may be removed by exposing the hard mask material 124 and the channel material 202 to a suitable etch chemistry, such as, any conventional etch chemistry formulated and configured to remove the hard mask material 124 and the channel material 202. In some embodiments, the adjacent trenches 204 may define the channel regions 104 therebetween.

The portions of the hard mask material 124 and channel material 202 may be removed such that bottom surfaces 206 of the trenches 204 are formed at a desired depth. The bottom surfaces 206 of the trenches 204 may substantially correspond (e.g., align in a horizontal direction) to upper surfaces of later-formed gate electrodes (i.e., word lines) of the apparatus 100. For instance, the trenches 204 may be etched to a depth of a desired upper surface of the later-formed (e.g., eventual) gate electrodes. Put another way, the bottom surfaces 206 of the trenches 204 may be substantially aligned horizontally within the channel material 202 with desired locations of the upper surfaces of eventual gate electrodes or at least the gate dielectric material between the later-formed gate electrodes and the channel material 202.

Figure 2C:
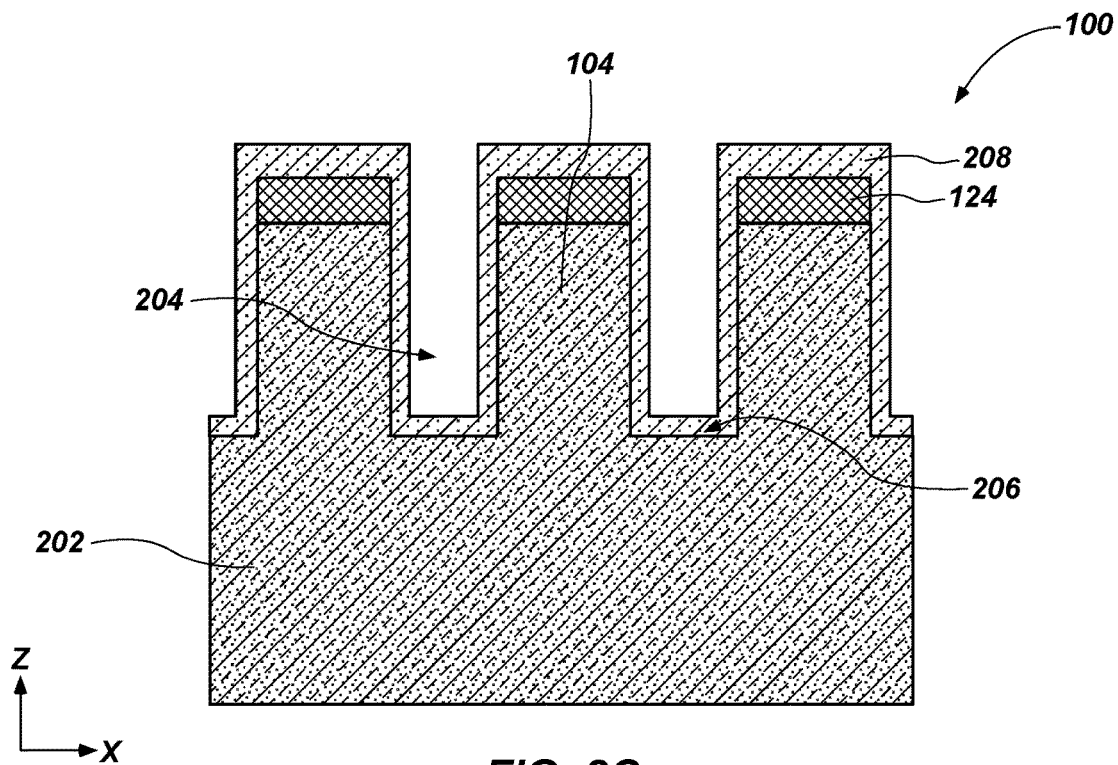

As shown in FIG. 2C, a liner material 208 may be formed over a top surface and sidewalls of remaining portions of the hard mask material 124 and over sidewalls and bottom surfaces 206 of the trenches 204. In some embodiments, forming the liner material 208 may include conformally forming the liner material 208. For instance, the liner material 208 may be formed conformally over exposed surfaces of the hard mask material 124 and channel material 202.

In some embodiments, the liner material may be 208 formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. A thickness of the liner material 208 (e.g., height in the vertical direction and width in the horizontal direction of the conformal liner material 208) may be, but is not necessarily limited to, from about 5 Å to about 20 nm. For example, the liner material 208 may have a thickness within a range of from about 5 nm to about 10 nm. For instance, the liner material 208 may have a thickness of about 10 nm. The thickness of the liner material 208 on the sidewalls of the channel regions 104 may at least partially determine a width of the later-formed gate electrodes of the apparatus 100.

In some embodiments, the liner material 208 may include a dielectric material, such as an oxide material. Furthermore, although embodiments of the disclosure are discussed in connection with an oxide liner material, the embodiments of the disclosure are not necessarily limited thereto, and can be applied with the same or similar results to thin film liner layers comprising other materials, such as, for example, titanium, tantalum, tungsten, cobalt, ruthenium, iridium, nickel, rhodium and their nitrides, oxides, silicides or other alloy materials. Furthermore, as is discussed in greater detail below, the liner material 208 may be selectively etchable relative to the channel material 202 and/or relative to the hard mask material 124.

Figure 2D:
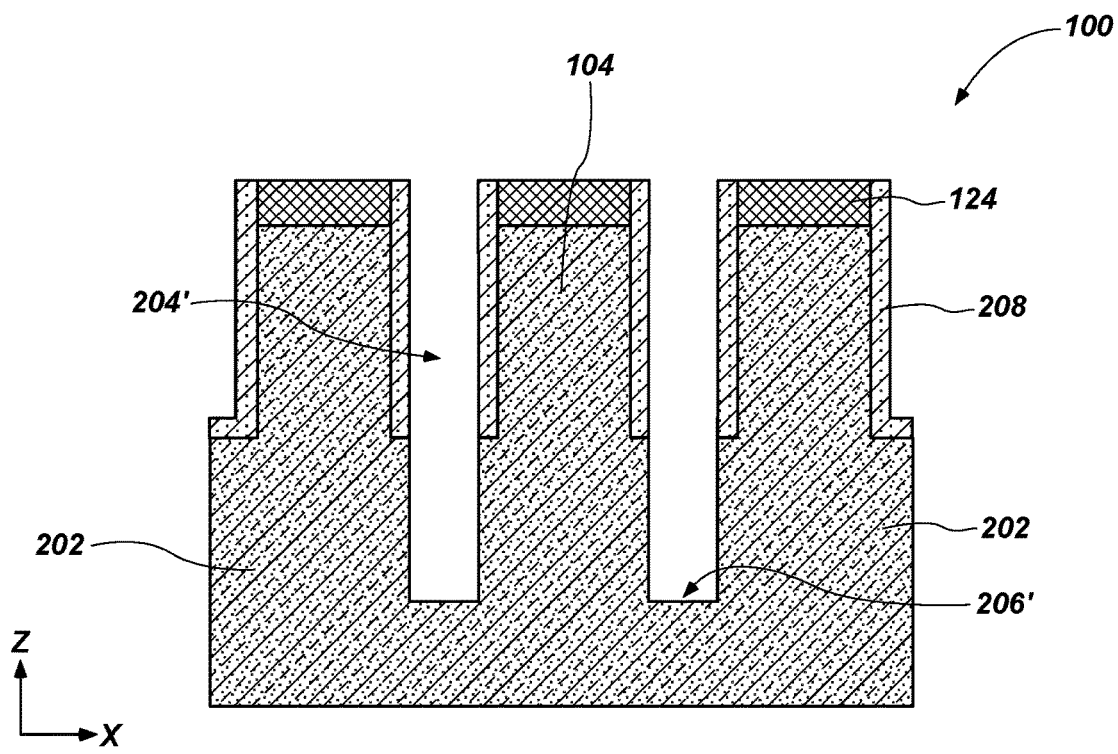

As shown in FIG. 2D, the method may include removing (e.g., etching) the liner material 208 from horizontal surfaces, such as from upper surface of the hard mask material 124 and from the bottom of the trenches 204 by exposing the liner material 208 to a suitable etch chemistry. Subsequently, underlying portions of the channel material 202 may be removed. For example, the method may include selectively removing the liner material 208 at the bottom of the trenches 204. In some embodiments, the liner material 208 may be removed via a directional etch process, such as, an anisotropic etch process (e.g., an anisotropic dry or wet etch). The liner material 208 may be removed in the vertical direction without substantially removing the liner material 208 in the horizontal direction or substantially removing the channel material 202. In some embodiments, the liner material 208 may be removed using a cyclic (i.e., repetitive) etching process (e.g., a cyclic punch).

Following removal of the liner material 208, a portion of the exposed channel material 202 beneath the removed portions of the liner material 208 (e.g., channel material 202 beneath the originally formed trenches 204) may be removed, elongating the trenches 204 to form elongated trenches 204'. The exposed channel material 202 may be removed using a directional etch process. The channel material 202 may be selectively removed such that portions of the liner material 208 (e.g., an oxide liner) are not substantially removed.

The elongated trenches 204' may extend into the channel material 202 a desired depth below the remaining portions of the liner material 208. For instance, the elongated trenches 204' may be elongated by a desired distance. For example, bottom surfaces 206' of the newly elongated trenches 204' may extend at least about 2 nm, about 5 nm, about 7 nm, about 10 nm, or about 15 nm below a lowermost surface of the liner material 208.

Figure 2E:
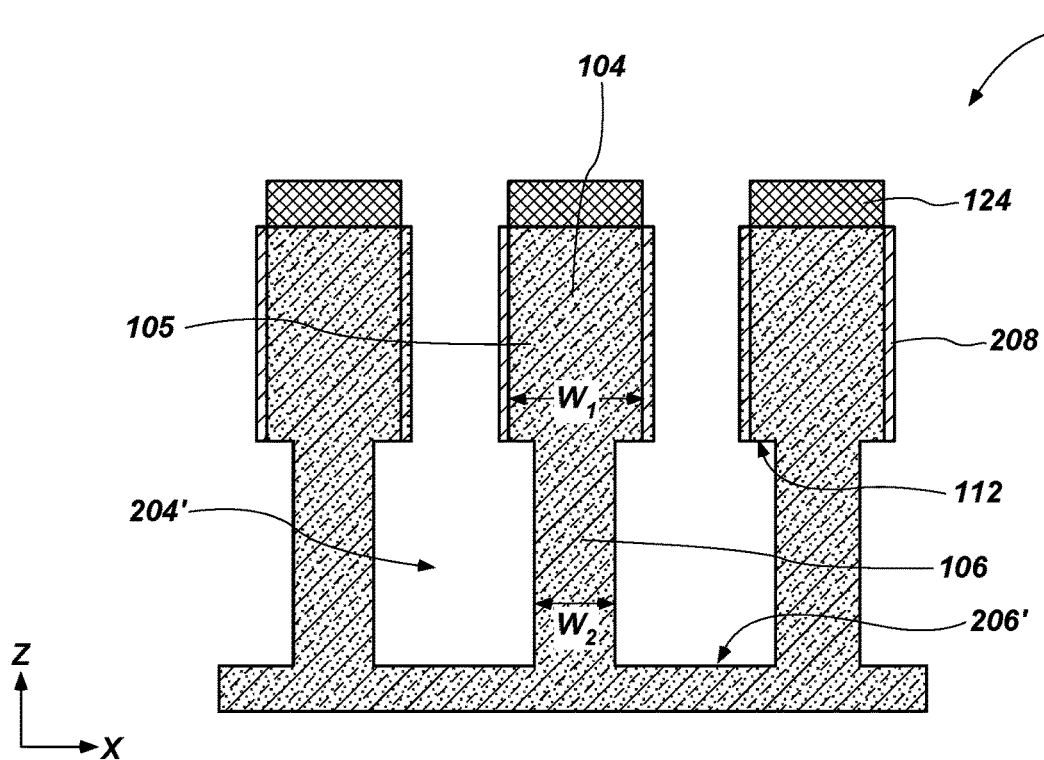

As shown in FIG. 2E, after elongating the trenches 204 (to form the elongated trenches 204'), the liner material 208 may be substantially removed and a portion of the channel material 202 may be removed in substantially a horizontal direction. For example, the liner material 208 and the channel material 202 may be removed via one or more directional etch processes, such as isotropic etch processes (e.g., isotropic dry etches and/or wet etches). The channel material 202 may be removed at a faster etch rate than the liner material 208, forming the overhang portions 112.

During the etch process, the liner material 208 protects the channel material 202 oriented horizontally adjacent to the liner material 208 (e.g., the channel material 202 lined by the liner material 208), while the channel material 202 beneath (e.g., vertically beneath) the liner material 208 is removed in a horizontal direction. Furthermore, because the liner material 208 protects a portion of the channel material 202, the isotropic etch process may undercut the channel material 202 not protected by the liner material 208, thus forming the upper regions 105, the lower regions 106, and the overhang portions 112 of the channel regions 104 of the vertical transistors 102 described above in regard to FIGS. 1A and 1B. Furthermore, undercutting the channel material 202 may enable the later-formed gate electrodes to be recessed into the lower regions 106 of the channel regions 104 and to be at least partially vertically beneath the upper regions 105 of the channel regions 104.

In view of the foregoing, an initial thickness of the liner material 208, the etch chemistry, and a duration of the etch process may be selected to enable a desired portion of the later-formed gate electrodes to be recessed within the channel regions 104 of the vertical transistors 102. Accordingly, the initial thickness of the liner material 208 may at least partially determine an amount of material that is removed from the channel material 202 during the etch process. For instance, the thickness of the liner material 208 may determine how much of the channel material 202 beneath (e.g., vertically beneath) the liner material 208 is etched without substantially removing (e.g., affecting) the channel material 202 laterally adjacent to the liner material 208. Therefore, as noted above, the thickness of the liner material 208 may be selected to achieve a desired amount of channel material 202 removed in a horizontal direction, which as a result, determines the width of the lower region 106 of the channel region 104 in the x-direction (e.g., the cross-sectional area of the lower region 106 of the channel region 104 in the x-y plane) and a ratio of the cross-sectional area of the upper region 105 in the xy plane and the cross-sectional area of the lower region 106 in the xy plane. In other words, the width of the liner material 208 may determine how much of the channel material 202 is undercut to form the upper region 105 and lower region 106 of the channel region 104. While FIGS. 1A and 2E illustrate substantially 90° corners at the interface between the lower region 106 of the channel region 104 and the upper region 105 of the channel region 104, the corners may be rounded depending on the etch process used.

As shown in FIG. 2E, not all of the liner material 208 may be removed during the isotropic etch process. However, the remaining liner material 208 may be removed from the upper regions 205 of the channel regions 104 of the vertical transistors 102 by a dry or wet etch process. For instance, the liner material 208 may be substantially removed by exposing the liner material 208 to a suitable etch chemistry selective for the liner material 208 such that the liner material 208 is removed without significantly removing the channel material 202 of the apparatus 100.

Figure 2F:
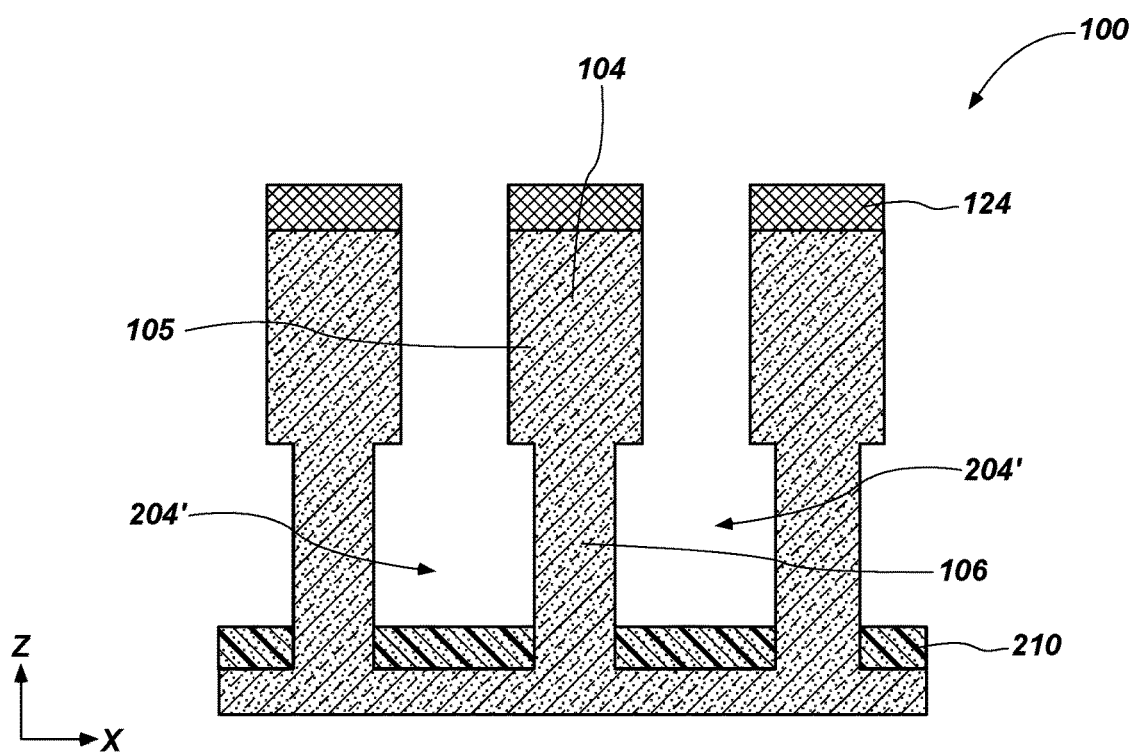

As shown in FIG. 2F, a spacer material 210 may then be formed in the elongated trenches 204' and a portion thereof subsequently removed to recess the spacer material 210 within the elongated trenches 204'. The portion of the spacer material 210 may be removed via a dry or wet etch process. The portion of the spacer material 210 may be selectively removed without significantly removing the channel material 202 of the apparatus 100. The spacer material 210 may, for example, be formed in the elongated trenches 204' by a spin-on process. The spacer material 210 may be a spin-on carbon material (e.g., a carbon hard mask).

The degree to which the spacer material 210 is recessed may serve to position the later-formed gate electrodes a desired distance from the bottom surface 206' of the elongated trenches 204'. For instance, the remaining portion of the spacer material 210 may space the later-formed gate electrodes from the bottom surface 206' of the elongated trenches 204' by a desired distance, and as a result, may space the gate electrodes from the lower contact 122 (e.g., the common lower contact 122) of the one or more vertical transistors 102. The remaining portion of the spacer material 210 may exhibit a thickness within a range of about 20 nm and about 50 nm. For instance, the spacer material 210 may be etched to have a thickness of about 35 nm.

Figure 2G:
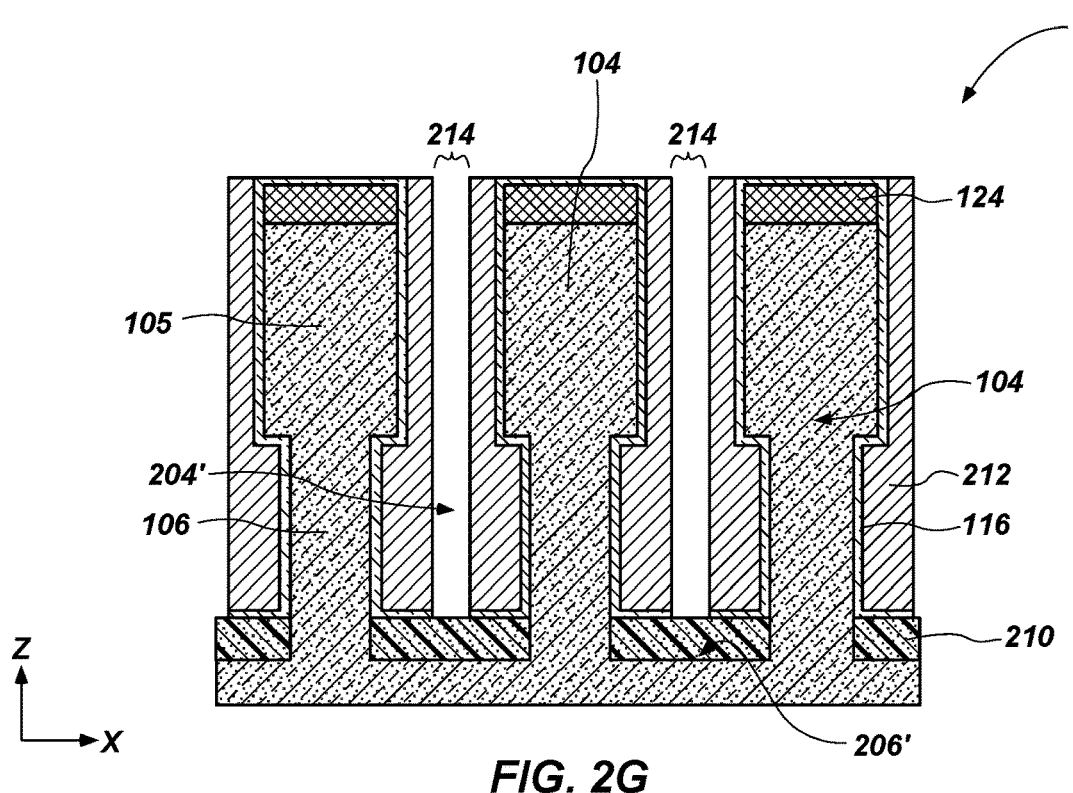

As shown in FIG. 2G, upon recessing the spacer material 210, a gate dielectric material 116 may be formed on the channel regions 104 (e.g., the pillars), within the elongated trenches 204' between the channel regions 104, and over the spacer material 210 within the elongated trenches 204'. In some embodiments, the gate dielectric material 116 may be formed by a conformal deposition process. For instance, the gate dielectric material 116 may be formed conformally over the channel regions 104 and the spacer material 210 within the elongated trenches 204', as depicted in FIG. 2G.

The gate dielectric material 116 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. In some embodiments, the gate dielectric material 116 may include an oxide material or any other dielectric material described above in regard to FIGS. 1A-1C. Furthermore, the gate dielectric material 116 may have any of the thicknesses described above in regard to FIGS. 1A-1C.

Referring still to FIG. 2G, a gate electrode material 212 may be formed on the gate dielectric material 116 and in the elongated trenches 204'. The gate electrode material 212 may include any of the electrically conductive materials described above in regard to FIGS. 1A-1C for the gate electrodes 114.

The gate electrode material 212 may be formed by at least substantially filling the elongated trenches 204' and covering the channel regions 104 (e.g., pillars) with the gate electrode material 212, and subsequently, removing a portion of the gate electrode material 212 to form recesses 214 within the gate electrode material 212 and through portions of the gate dielectric material 116 to expose the spacer material 210 on the bottom surfaces 206' of the elongated trenches 204'. For example, the gate electrode material 212 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. The recesses 214 in the gate electrode material 212 may be formed by conventional techniques, such as by a directional etch process (e.g., an anisotropic etch process, such as an anisotropic dry or wet etch process) that removes the gate electrode material 212 and gate dielectric material 116 without significantly removing other exposed materials (e.g., the hard mask material 124) of the apparatus 100.

The recesses 214 may be formed to a desired width (e.g., thickness) such that portions of the gate electrode material 212 remain adjacent to the lower regions 106 of the channel regions 104 in the x-direction. In other words, the width of the recesses 214 may be selected to result in a desired width of the gate electrodes 114 (e.g., word lines) formed from the gate electrode material 212 of the apparatus 100. As noted above in regard to FIGS. 1A-1C, at least one-third of the overall width of the gate electrodes 114 may be vertically beneath (e.g., nested into) the overhang portion 112 of the upper region 105 of the channel region 104 of the vertical transistor 102. In additional embodiments, at least one-half of the overall width of the gate electrodes 114 may be recessed into the channel region 104 of the vertical transistor 102. In further embodiments, at least two-thirds of an overall width of the gate electrodes may be recessed into the channel region 104 of the vertical transistor 102. In further embodiments, substantially all of the gate electrodes 114 may be recessed into the channel region 104 of the vertical transistor 102. Accordingly, the recesses 214 may be formed to assist in achieving the above-described amounts of the gate electrode material 212 being recessed within the channel region 104.

Figure 2H:
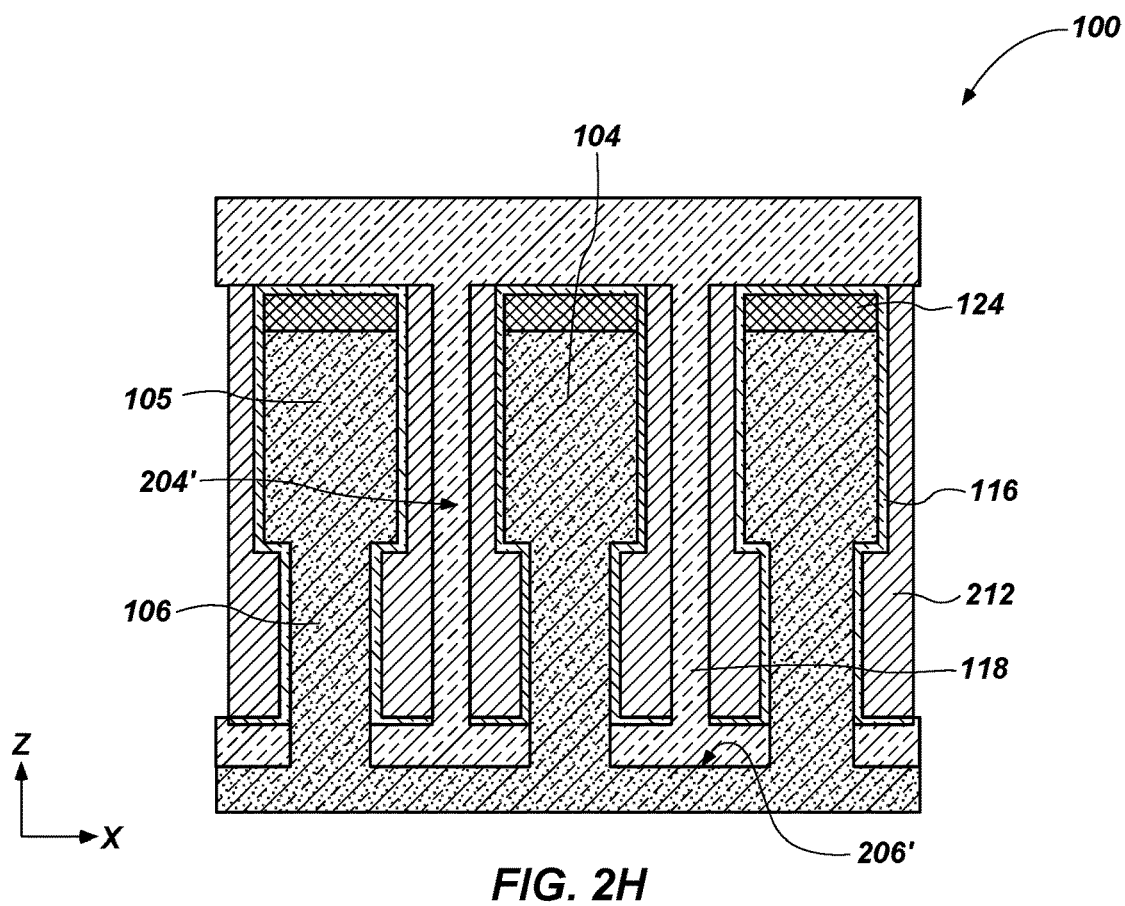

As shown in FIG. 2H, the spacer material 210 may be removed from beneath the gate electrode material 212 and the gate dielectric material 116. For example, the spacer material 210 may be removed (e.g., stripped) via conventional techniques. Furthermore, the spacer material 210 may be selectively removed relative to other exposed materials and/or portions of the apparatus 100.

As shown in FIG. 2H, the insulative material 118 may be formed within the recesses 214, below the gate electrode material 212 and the gate dielectric material 116, and over the hard mask material 124. The insulative material 118 may be a spin-on dielectric material and may be formed by a spin coating process. Moreover, the insulative material 118 may include any of the materials described above in regard to FIGS. 1A-1C. The insulative material 118 may optionally be subjected to an annealing process.

Figure 2I:
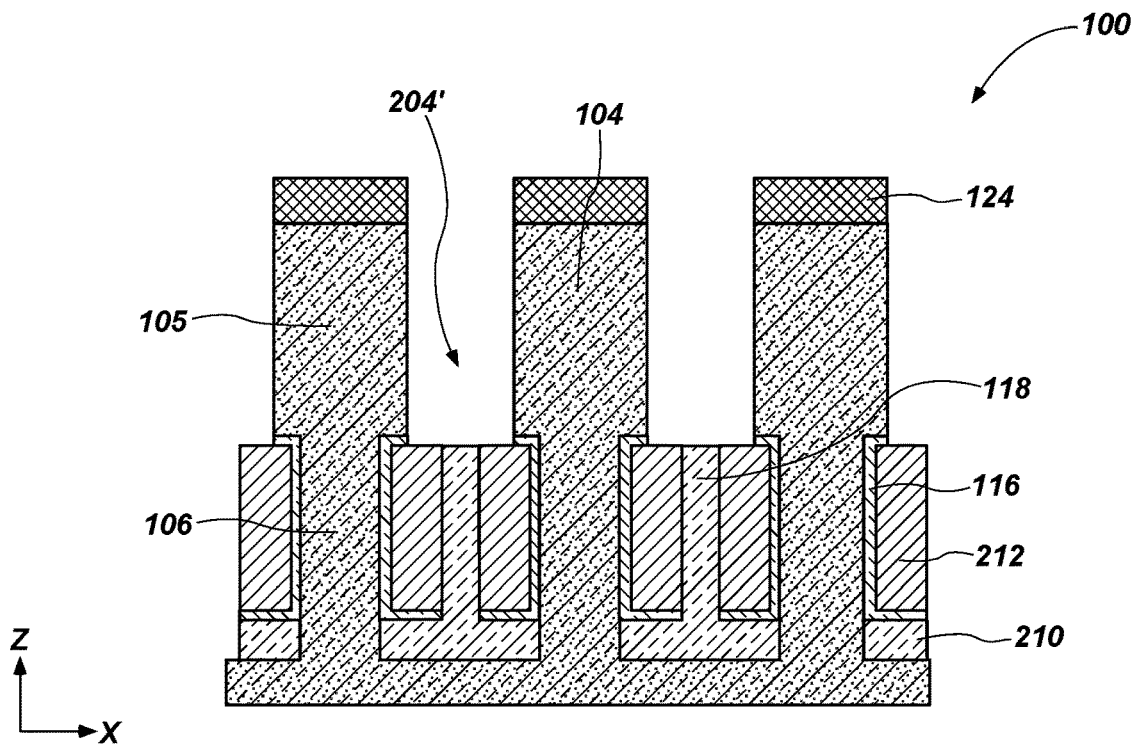
Figure 2J:
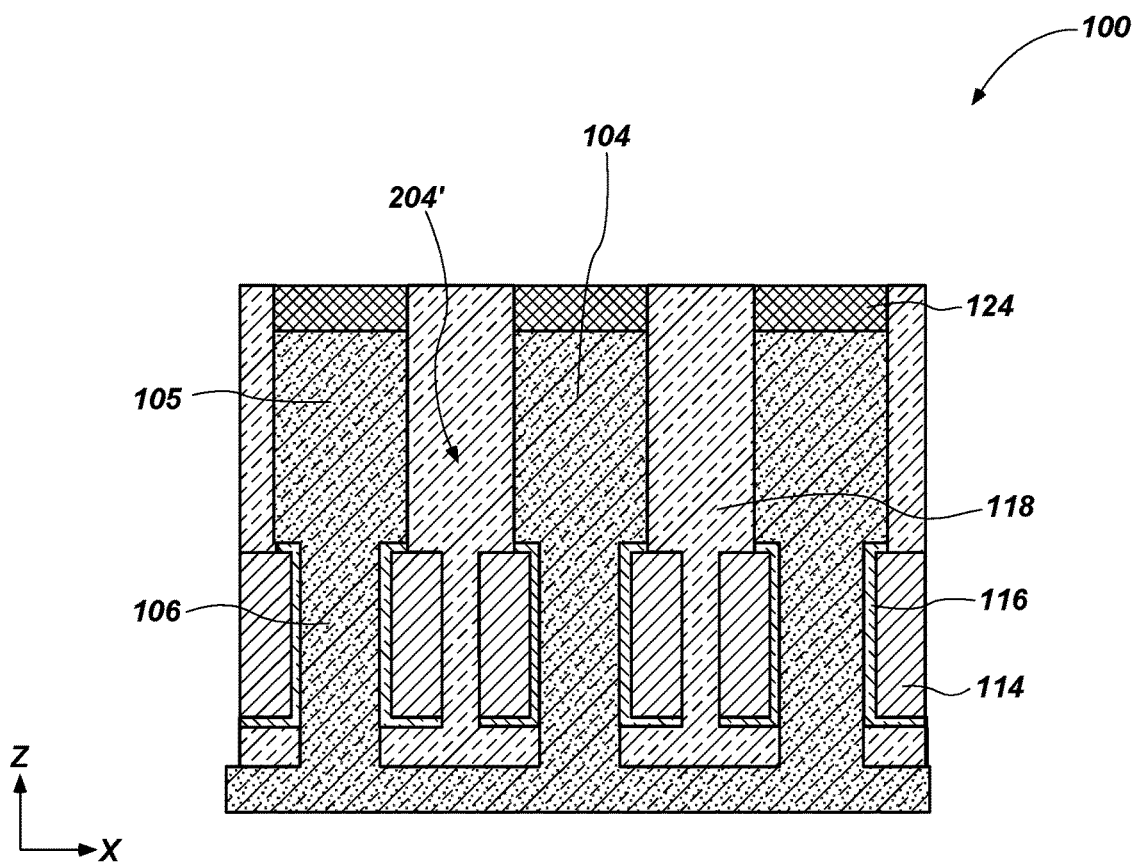

As is shown in FIG. 2I, portions of the gate electrode material 212, gate dielectric material 116, and insulative material 118 within the elongated trenches 204' of the apparatus 100 may be removed. The portions of the gate electrode material 212, gate dielectric material 116, and insulative material 118 may be removed via an anisotropic etch process, such as an anisotropic dry or wet etch process. The portions of the gate electrode material 212, gate dielectric material 116, and insulative material 118 may be selectively removed without removing other exposed materials of the apparatus 100.

Portions of the gate electrode material 212, gate dielectric material 116, and insulative material 118 lateral to the upper region 105 and above the overhang portions 112 may be removed from the elongated trenches 204'. For example, the portions of the gate electrode material 212, gate dielectric material 116, and insulative material 118 that are horizontally adjacent to the upper regions 105 of the channel regions 104 may be removed while the gate electrode material 212, gate dielectric material 116, and insulative material 118 that are horizontally adjacent to the lower regions 106 of the channel regions 104 are not substantially removed, as depicted in FIG. 2I. The remaining portions of the gate electrode material 212 and the gate dielectric material 116 that are horizontally adjacent to the lower regions 106 of the channel regions 104 define the gate electrodes 114.

Moreover, as noted above, at least a portion of each gate electrode 114 is recessed within the channel region 104. By recessing at least a portion of the gate electrode 114 within the channel region 104, the upper region 105 of the channel region 104 may exhibit a larger width than the width of the lower region 106. As a result, the upper contact 120 may exhibit a larger cross-sectional area than would otherwise be possible with a conventional vertical transistor having a comparable WL-WL distance. Additionally, because the upper region 105 has a larger cross-sectional area relative to the lower region 106, the vertical transistor 102 of the disclosure reduces external timing resistance (Rext). Furthermore, the smaller cross-sectional area of the lower region 106 in comparison to the upper region 105 (due to the gate electrodes 114 being recessed within the channel region 104) reduces external timing resistance (Rext) without affecting a distance between gate electrodes 114 (e.g., WL-WL distance).

By including the gate electrodes 114 within the lower region 106 of the channel region 104 and forming the lower region 106 to have a smaller cross-sectional area, the vertical transistor 102 of the disclosure improves drive within the vertical transistor 102 relative to conventional vertical transistors. Moreover, the vertical transistors of the disclosure improve $I_{ON/OFF}$ functionality of the vertical transistors. Furthermore, the apparatus 100 of the disclosure may improve parasitic capacitance between gate electrodes 114 (i.e., word lines). The foregoing advantages also result in semiconductors having improved performance and yield.

The apparatus 100 may be subjected to an optional cleaning process before forming additional portions of the insulative material 118 in the elongated trenches 204'. For instance, the empty portions of the elongated trenches 204' may be substantially completely filled with the insulative material 118 via any conventional spin-on process, with the insulative material 118 including any of the insulative materials described above in regard to FIGS. 1A-1C. Any excess insulative material 118 formed above and/or on the top surface of the hard mask material 124 of the apparatus 100 may be removed, such as by a chemical mechanical planarization process, to form the apparatus 100 described above in regard to FIGS. 1A-1C. The hard mask material 124 may optionally be removed from adjacent the channel region 104 before forming the upper contact 120.

Figure 3:
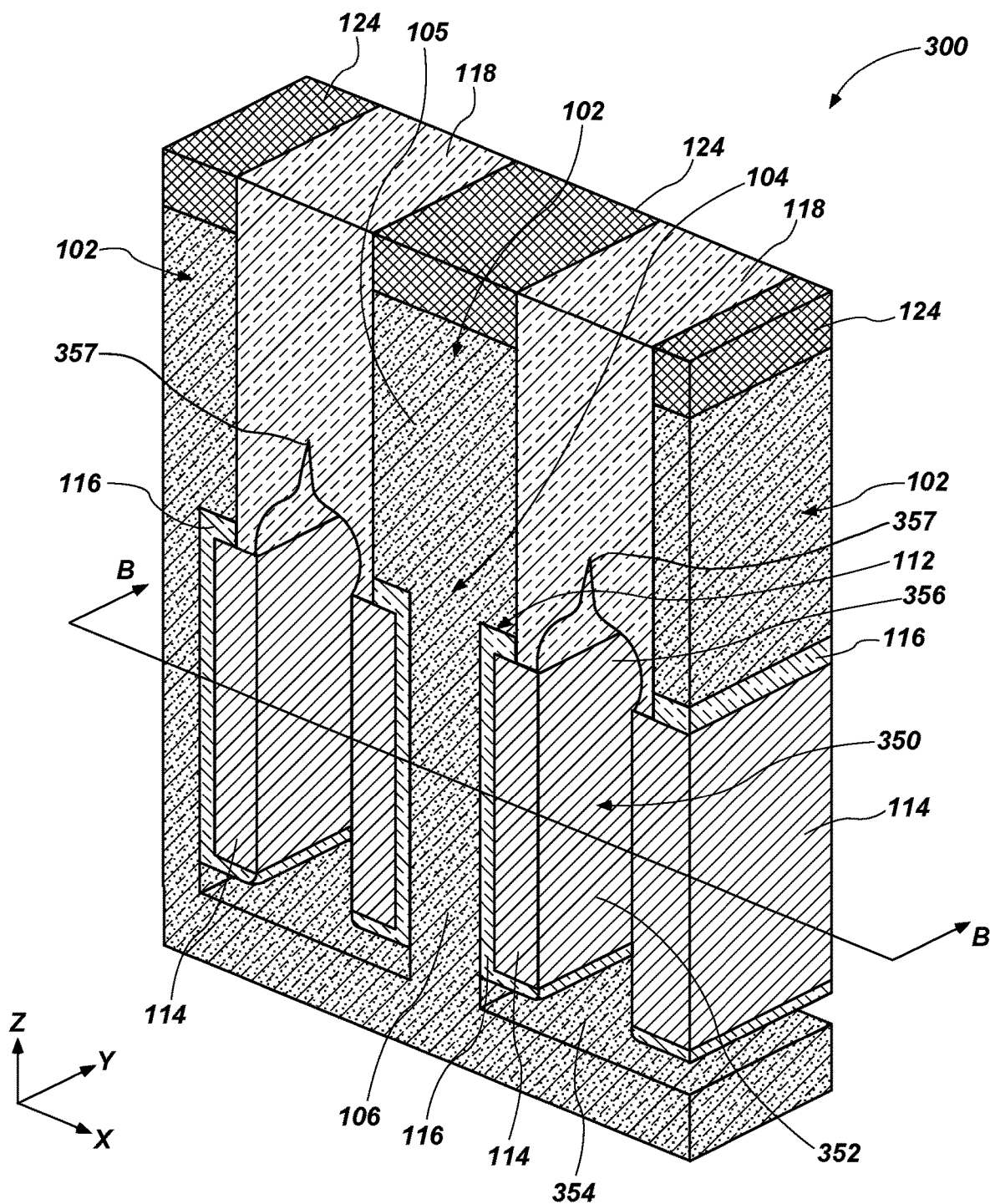
FIG. 3 is a simplified cutaway perspective view of an apparatus including vertical transistors, in accordance with embodiments of the disclosure.

FIG. 3 a simplified cross-sectional perspective view of an apparatus 300 (e.g., electronic device, microelectronic device, semiconductor device, memory device) according to one or more additional embodiments of the disclosure. The apparatus 300 may include vertical transistors 102 similar to the apparatus 100 described above in regard to FIGS. 1A-2J. Furthermore, similar to the apparatus 100 described above in regard to FIGS. 1A-2J, the apparatus 300 may include channel regions 104 having upper and lower regions 105, 106. Moreover, similar to the apparatus 100 described above in regard to FIGS. 1A-2J, the apparatus 300 may include gate electrodes 114 and gate dielectric material 116.

However, instead of insulative material 118 between adjacent channel regions 104, the apparatus 300 may include an air gap 350 between the adjacent channel regions 104, as depicted in FIG. 3. For instance, the apparatus 300 may include the air gap 350 within at least a lower region of each trench 204. The air gap 350 may be proximal to gate electrodes 114. The air gap 350 is defined by sidewalls of the gate electrodes 114, surfaces of the channel regions 104, and surfaces of the insulative material 118. While FIG. 3 illustrates the air gap 350 as exhibiting a pointed portion proximal to the upper region 105 of the channel region 104, a cross-sectional shape of the air gap 350 may differ from that illustrated depending on the material and process used to form the insulative material 118. In some embodiments, the cross-sectional shape of the air gap 350 within the xz plane may include a general rectangular middle section 352 extending from a wider base section 354 and may have an ogive top section 356. The ogive top section 356 of the air gap 350 may terminate in an extended point 357. Having the air gap 350 between the gate electrodes 114 may reduce parasitic capacitance between gate electrodes 114 (e.g., word lines) in comparison to conventional vertical transistors.

Figure 4A:
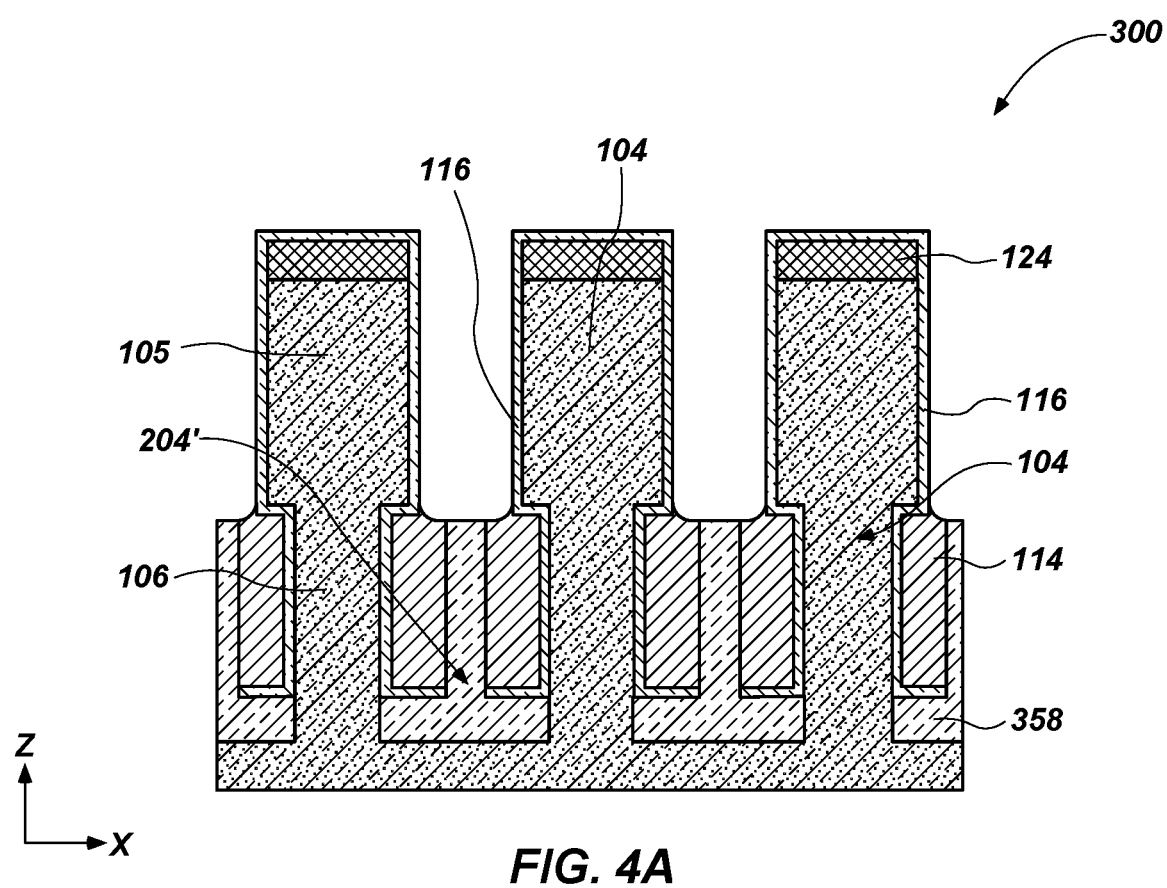
FIGS. 4A-4C illustrate a method of forming the apparatus, in accordance with embodiments of the disclosure.
Figure 4B:
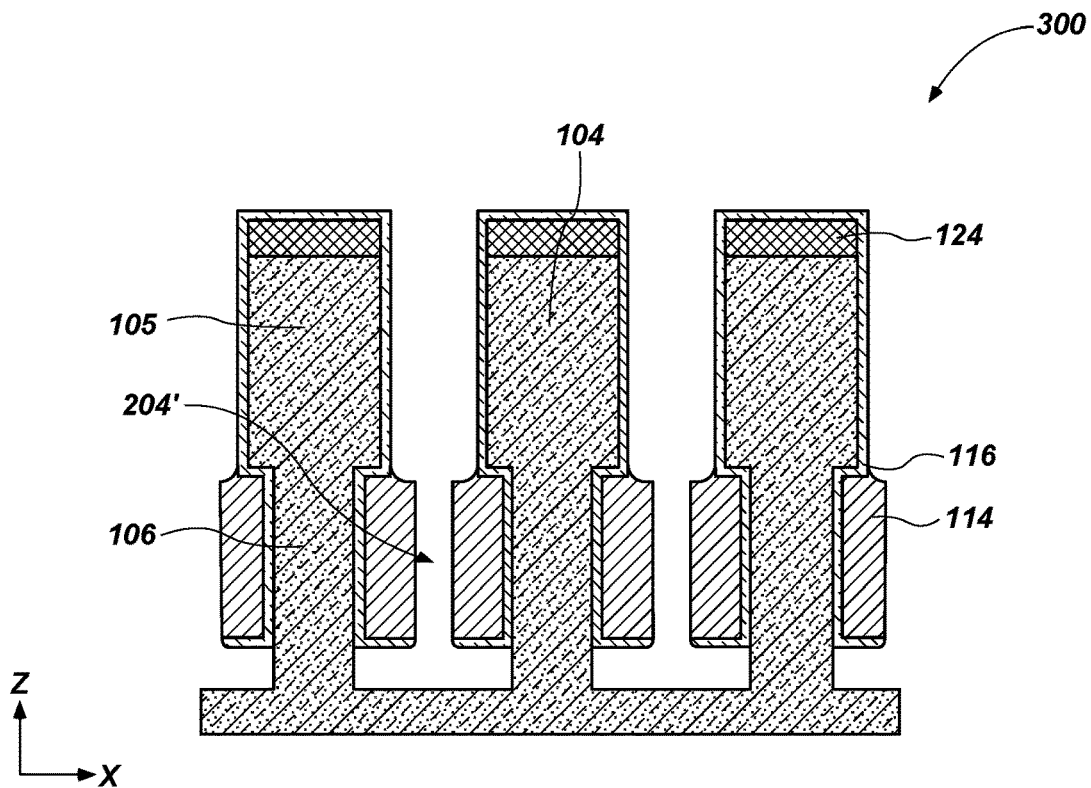
Figure 4C:
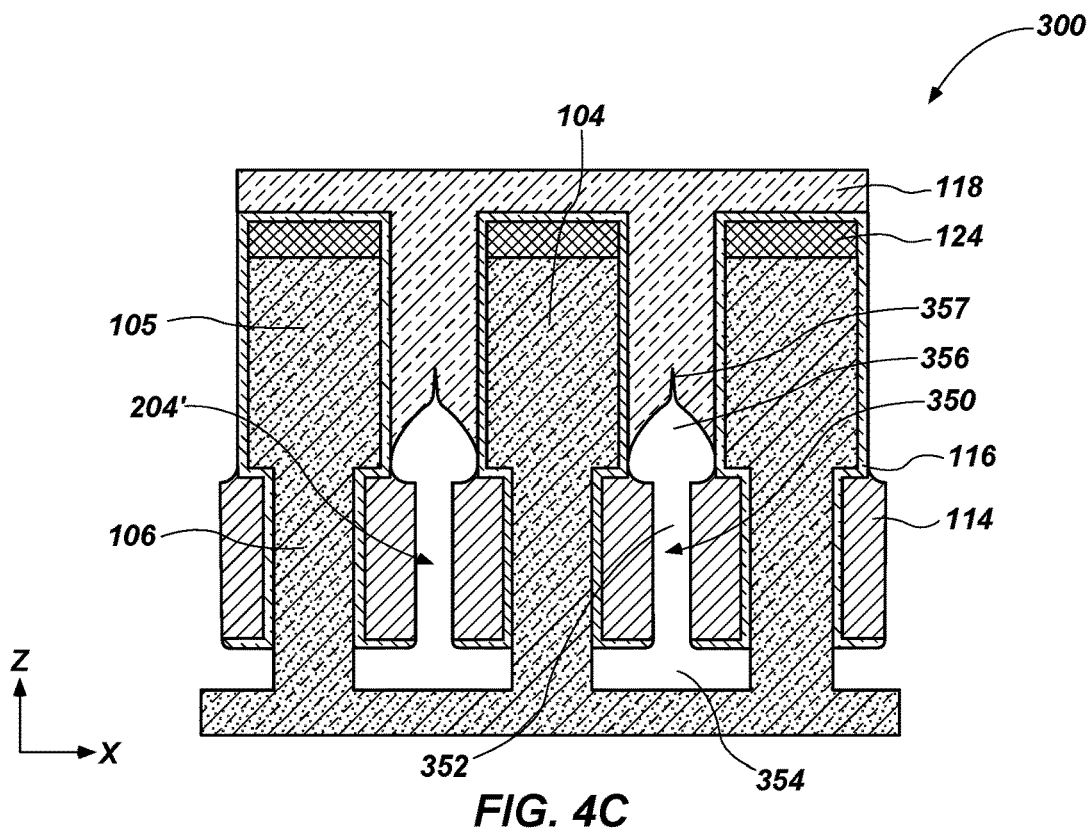

FIGS. 4A-4C show a method of forming an apparatus 300 as described above with reference to FIG. 3 according to one or more alternative embodiments of the disclosure. The method includes the same process acts as described above in regard to FIGS. 2A-2G, followed by the method acts illustrated in FIGS. 4A-4C.

After removing the spacer material 210 from beneath the gate electrode material and the gate dielectric material, as described above in regard to FIG. 2G, a dielectric material 358 may be formed in the recesses 214. The dielectric material 358 may be formed adjacent (e.g., over) the spacer material 210 in the recesses 214. By way of example only, the dielectric material 358 may be a carbon material formed by a spin-on process, as shown in FIG. 4A.

After forming the dielectric material 358 within the recesses 214, portions of the gate electrode material 212, gate dielectric material 116, and dielectric material 358 may be removed within the elongated trenches 204' of the apparatus 300. One or more etch processes may be conducted to remove the desired portions of the gate electrode material 212, gate dielectric material 116, and dielectric material 358. For example, portions of the gate electrode material 212, gate dielectric material 116, and dielectric material 358 may be removed via an anisotropic etch process, such as an anisotropic dry or wet etch process. The gate electrode material 212, gate dielectric material 116, and dielectric material 358 may be removed adjacent to the upper region 105 while the gate electrode material 212, gate dielectric material 116, and dielectric material 358 remain adjacent to the lower region 106 of the channel region 104. The gate electrode material 212, gate dielectric material 116, and dielectric material 358 may be removed from above the overhang portions 112, such that the remaining portions of the gate electrode material 212 (i.e., the later-formed gate electrodes 114 (i.e., word lines)) are recessed within the channel material 202. The remaining portions of the gate electrode material 212 define the gate electrodes 114.

The dielectric material 358 within the elongated trenches 204' may then be removed, as shown in FIG. 4B, so that the elongated trenches 204' are substantially free of the dielectric material 358. The dielectric material 358 may be removed by any conventional removal process that is selective to the dielectric material 358 such that other exposed materials and/or portions of the apparatus 300 are not substantially removed.

The insulative material 118 may be formed in the elongated trenches 204', as shown in FIG. 4C, with the insulative material 118 being one of the previously discussed materials. However, due to the larger cross-sectional areas of the upper regions 105 of the channel regions 104 and the smaller cross-sectional areas of the lower regions 106 between the lower regions 106 of adjacent vertical transistors 102, the insulative material 118 may not be formed within lower regions of the elongated trenches 204'. The spin coating process of forming the insulative material 118 in the elongated trenches 204' may result in air becoming trapped within the lower regions of the elongated trenches 204'. Other processes of forming the insulative material 118 may also result in the formation of air gaps 350. By way of example only, the air gaps 350 may be formed within the lower regions of the elongated trenches 204' while the insulative material 118 forms within upper regions of the elongated trenches 204'. As a result, the insulative material 118 may be formed adjacent to the upper regions 105 of the channel region 104 while the air gap 350 (i.e., an air pocket) is between the gate electrodes 114 of adjacent channel regions 104, as shown in FIG. 4C. As discussed above, having the air gaps 350 may reduce parasitic capacitance between adjacent gate electrodes 114 in comparison to conventional vertical transistors.

The apparatus 100, 300 including the vertical transistors 102 according to embodiments of the disclosure may be incorporated into memory cells of memory devices, such as DRAM memory devices. The vertical transistors 102 may be electrically coupled to a storage element (e.g., a capacitor) (not shown) configured to store a logical state (e.g., a binary value of either 0 or 1) defined by the storage charge in the capacitor. The vertical transistors 102 are also electrically coupled to the first and second conductive lines (e.g., digit lines) as previously described.

Figure 5:
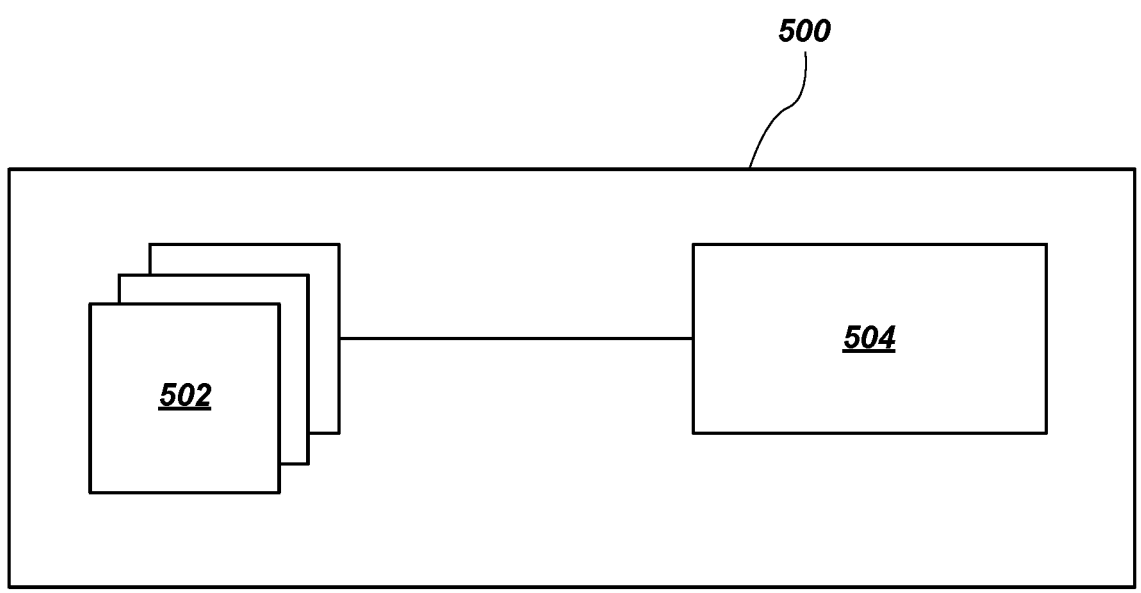
FIG. 5 is a functional block diagram of a memory device including a memory array comprising vertical transistors in accordance with embodiments of the disclosure.

FIG. 5 illustrates a simplified block diagram of a memory device 500 in accordance with embodiments of the disclosure. The memory device 500 includes at least one memory cell having at least one vertical transistor 102 according to embodiments of the disclosure, as described above, in operative communication with the storage element. The vertical transistor 102 may act as a switch for enabling and disabling current flow through the memory cell. By way of non-limiting example, the vertical transistor 102 may include the recessed gate electrodes 114 as described above. The memory device 500 includes a memory array 502 comprising the memory cells and a control logic component 504. The memory array 502 may include multiple memory cells including the at least one vertical transistor # according to embodiments of the disclosure. The control logic component 504 may be configured to operatively interact with the memory array 502 so as to read, write, or re-fresh any or all memory cells within the memory array 502.

While the vertical transistors according to embodiments of the disclosure have been described and illustrated in reference to a 3D electronic device, such as a 3D DRAM memory device, the vertical transistors may be incorporated in other apparatus, such as memory cells, arrays including the memory cells, memory devices, switching devices, other electronic devices including the arrays, and systems including the arrays. Embodiments of the vertical transistors may be used in a variety of different memory cells (e.g., volatile memory, non-volatile memory) and/or transistor configurations. Non-limiting examples include random-access memory (RAM), read-only memory (ROM), dynamic random access memory (DRAM), synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), etc.

Figure 6:
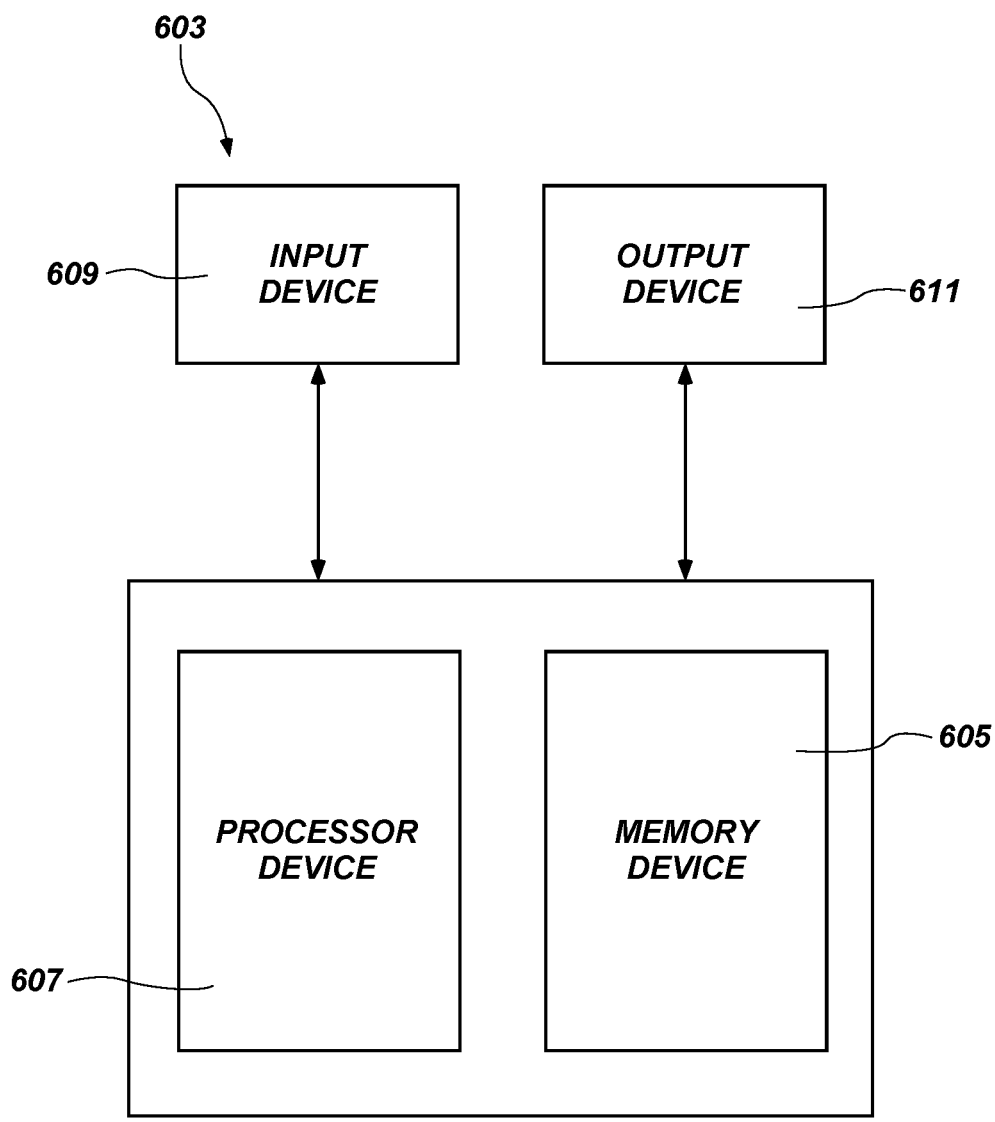
FIG. 6 is a schematic block diagram of an electronic system, in accordance with embodiments of the disclosure.

Apparatuses (e.g., electronic devices, microelectronic devices, semiconductor devices, memory devices) (e.g., the apparatuses 100, 300) including the gate electrodes (e.g., gate electrodes 114) recessed within (e.g., nested within) channel regions (e.g., the channel regions 104) in accordance with embodiments of the disclosure may be used in embodiments of electronic systems of the disclosure. FIG. 6 is a block diagram of an illustrative electronic system 603 according to embodiments of disclosure and including the recessed gate electrodes 114. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 603 includes at least one memory device 605. The memory device 605 may include, for example, one or more apparatus previously described herein (e.g., apparatus 100, 300), wherein the gate electrodes (e.g., gate electrodes 114) are recessed within the channel regions 104.

The electronic system 603 may further include at least one electronic signal processor device 607 (often referred to as a "microprocessor"). The electronic signal processor device 607 may, optionally, include an embodiment of an apparatus (e.g., the apparatus 100, 300) previously described herein. The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607.

Some embodiments of the disclosure include an apparatus (e.g., electronic device, microelectronic device, semiconductor device, memory device). The apparatus may include at least one vertical transistor having a channel region. The channel region may include an upper region having a first width and a lower region below the upper region and having a second width smaller than the first width. The upper region may define at least one overhang portion extending laterally beyond the lower region. The at least one vertical transistor may further include gate electrodes at least partially vertically beneath the at least one overhang portion of the upper region of the channel region.

Further embodiments of the disclosure include a method of forming an apparatus. The method may include removing portions of a channel material to form one or more channel regions separated by trenches, forming a liner material over bottom surfaces of the trenches and over sidewalls of the one or more channel regions; removing portions of the liner material from horizontal surfaces of the one or more channel regions; removing exposed portions of the channel material to form elongated trenches; removing portions of the channel material below the liner material without substantially removing the liner material to form upper regions of the channel regions and lower regions of the channel regions, each upper region defining at least one overhang portion extending outward beyond an outer boundary of a respective lower region; forming a gate dielectric material over the sidewalls of the lower regions and at least the at least one overhang portion of each of the upper regions of the channel regions; and forming gate electrodes adjacent to the gate dielectric material, at least a portion of each gate electrode being beneath a respective overhang portion of a respective upper region of the one or more channel regions.

Additional embodiments of the disclosure include an apparatus. The apparatus may include at least one vertical transistor. The at least one vertical transistor may include a channel region, at least one gate electrode at least partially recessed within the channel region relative to an outermost surface of the channel region in a direction orthogonal to a longitudinal axis of the at least one vertical transistor, and a gate dielectric material disposed between the at least one gate electrode and the channel region.

Embodiments of the disclosure include an additional apparatus. The apparatus may include at least one vertical transistor. The at least one vertical transistor may include a channel region, gate electrodes at least partially recessed within the channel region relative to an outermost surface of the channel region in a direction orthogonal to a longitudinal axis of the at least one vertical transistor, and a gate dielectric material between the gate electrodes and the channel region.

Embodiments of the disclosure include a memory array. At least one memory cell of the memory cells may include at least one vertical transistor. The at least one vertical transistor may include a channel region including an upper region and a lower region, a width of the lower region being less than a width of the upper region and gate electrodes laterally adjacent to the lower region of the channel region, at least a portion of the gate electrodes recessed below the upper region of the channel region, and a storage element in operative communication with the at least one vertical transistor.

Some embodiments of the disclosure include a system having at least one input device, at least one output device, at least one processor device operably coupled to the at least one input device and the at least one output device, and an apparatus operably coupled to the at least one processor device. The apparatus may include an array of memory cells comprising vertical transistors. One or more of the vertical transistors may include a channel region including an upper region exhibiting a first width and a lower region extending downward from the upper region and exhibiting a second width, wherein the second width is smaller than the first width, wherein an interface between the upper region and the lower region defines at least one overhang portion, at least one gate electrode at least partially disposed vertically beneath the at least one overhang portion of the upper region of the channel region, and a gate dielectric material between the at least one gate electrode and the at least one overhang portion of the upper region and between the at least one gate electrode and the lower region of the channel region.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
 a first vertical transistor;
 a second vertical transistor adjacent to the first vertical transistor, each of the first vertical transistor and the second vertical transistor comprising:
  a channel region comprising:
   an upper region having a first width; and
   a lower region below the upper region and having a second width smaller than the first width, and wherein the upper region defines at least one overhang portion extending laterally beyond the lower region; and
  gate electrodes each having a first portion vertically beneath the at least one overhang portion of the upper region of the channel region, and a second portion extending past the at least one overhang portion of the upper region of the channel region;
 a gate dielectric material adjacent to the gate electrodes;
 a conductive contact underlying the gate electrodes; and
 an insulative structure directly intervening between a gate electrode of the first vertical transistor and a gate electrode of the second vertical transistor, an insulative material of the insulative structure directly intervening between an upper region of a channel region of the first vertical transistor and an upper region of a channel region of the second vertical transistor, and the insulative material of the insulative structure directly vertically intervening between the gate dielectric material and the conductive contact in regions underlying the gate electrodes.

2. The apparatus of claim 1, wherein sidewalls of the upper region and sidewalls of the lower region are substantially vertical.

3. The apparatus of claim 1, wherein the insulative material of the insulative structure is directly between the gate electrode of the first vertical transistor and the gate electrode of the second vertical transistor.

4. The apparatus of claim 1, wherein the insulative structure comprises an air gap directly intervening between the gate electrode of the first vertical transistor and the gate electrode of the second vertical transistor.

5. The apparatus of claim 4, wherein at least a portion of the air gap is laterally adjacent to the lower region of the channel region.

6. The apparatus of claim 4, wherein at least a portion of the air gap is laterally adjacent to the upper region of the channel region.

7. The apparatus of claim 1, wherein the gate electrodes are laterally adjacent to the lower region of the channel region.

8. The apparatus of claim 1, wherein the gate electrodes are at least partially recessed into the lower region of the channel region.

9. The apparatus of claim 1, wherein a ratio of the second width of the lower region of the channel region and the first width of the upper region of the channel region is between 0.25 and 0.85.

10. The apparatus of claim 1, further comprising a conductive material over the upper region of the channel region, wherein the conductive contact comprises another conductive material below the lower region of the channel region.

11. The apparatus of claim 1, wherein a distance by which the at least one overhang portion of the upper region extends over a gate electrode of the gate electrodes is at least one-third of an overall width of the gate electrode.

12. The apparatus of claim 1, wherein a distance by which the at least one overhang portion of the upper region extends over a gate electrode of the gate electrodes is at least one-half of an overall width of the gate electrode.

13. The apparatus of claim 1, wherein a distance by which the at least one overhang portion of the upper region extends over a gate electrode of the gate electrodes is at least two-thirds of an overall width of the gate electrode.

14. The apparatus of claim 1, wherein upper surfaces of the gate electrodes are below a vertical elevation of a lowermost boundary of the at least one overhang portion of the upper region of the channel region.

15. The apparatus of claim 1, wherein the gate dielectric material extends between the gate electrodes and the at least one overhang portion of the upper region and between the gate electrodes and the lower region of the channel region.

16. A method of forming vertical transistors of an apparatus, the method comprising:
   forming a conductive contact;
   removing portions of a channel material to form one or more channel regions separated by trenches;
   forming a liner material over bottom surfaces of the trenches and over sidewalls of the one or more channel regions;
   removing portions of the liner material from horizontal surfaces of the one or more channel regions;
   removing exposed portions of the channel material to form elongated trenches;
   removing portions of the channel material below the liner material without substantially removing the liner material to form upper regions of the channel regions having a first width and lower regions of the channel regions below a respective upper region and having a second width smaller than the first width, each upper region defining at least one overhang portion extending laterally beyond an outer boundary of a respective lower region;
   forming a gate dielectric material over the sidewalls of the lower regions and at least the at least one overhang portion of each of the upper regions of the channel regions;
   forming gate electrodes over the conductive contact and adjacent to the gate dielectric material, a first portion of each gate electrode being vertically beneath a respective overhang portion of a respective upper region of the one or more channel regions and a second portion extending past the at least one overhang portion of the upper region of the channel region, wherein each gate electrode is at least partially recessed within a respective channel region relative to an outermost surface of the respective channel region in a direction orthogonal to a longitudinal axis of a respective vertical transistor; and
   forming an insulative structure directly between a gate electrode of a first vertical transistor and a gate electrode of a second vertical transistor adjacent to the first vertical transistor, an insulative material of the insulative structure directly intervening between an upper region of a channel region of the first vertical transistor and an upper region of a channel region of the second vertical transistor, and the insulative material of the insulative structure directly vertically intervening between the gate dielectric material and the conductive contact in regions underlying the gate electrodes.

17. The method of claim 16, further comprising:
   forming a spacer material on bottom surfaces of the elongated trenches;
   forming the gate dielectric material over the spacer material, the lower regions of the one or more channel regions, and the upper regions of the one or more channel regions;
   forming a gate electrode material over the gate dielectric material within the elongated trenches;
   forming recesses through the gate electrode material to expose the spacer material;
   forming additional portions of the insulative material in the recesses and over the bottom surfaces of the elongated trenches;
   removing portions of the gate dielectric material and the gate electrode material horizontally adjacent to the upper regions of the one or more channel regions; and
   forming the insulative material within the elongated trenches.

18. The method of claim 16, wherein removing the portions of the liner material from the horizontal surfaces of the one or more channel regions and removing the portions of the channel material below the liner material comprises removing the channel material at a greater rate than the liner material.

19. The method of claim 16, further comprising:
   forming a spacer material on bottom surfaces of the elongated trenches;
   forming the gate dielectric material over the spacer material, the lower regions of the one or more channel regions, and the upper regions of the one or more channel regions;
   forming a gate electrode material over the gate dielectric material within the elongated trenches;
   forming recesses through the gate electrode material to expose the spacer material;
   forming additional spacer material within the recesses;
   removing portions of the gate dielectric material, the gate electrode material, and the spacer material horizontally adjacent to the upper regions of the one or more channel regions;
   removing remaining portions of the spacer material within the elongated trenches; and
   forming the insulative material within a portion of the elongated trenches, an additional portion of the elongated trenches adjacent to the lower regions of the channel regions comprising an air gap.

20. An apparatus, comprising:
   at least one vertical transistor, comprising:
      a channel region;
      gate electrodes at least partially recessed within the channel region relative to an outermost surface of the channel region in a direction orthogonal to a longitudinal axis of the at least one vertical transistor; and
      a gate dielectric material directly intervening between the gate electrodes and the channel region, wherein a portion of the gate dielectric material extends along a lower end of the gate electrodes proximal to a conductive contact, and the portion of the gate dielectric material vertically separated from the conductive contact by a second dielectric material along a horizontal extent of the portion of the gate dielectric material, portions of the second dielectric material directly physically contacting lateral end surfaces of the gate dielectric material at an upper end of the gate electrodes, and additional portions of the second dielectric material directly physically contacting lateral end surfaces of the gate dielectric material at the lower end of the gate electrodes.

21. The apparatus of claim 20, wherein a distance by which each gate electrode of the gate electrodes is recessed within the channel region relative to an outermost surface of the channel region is at least one-half of an overall width of the gate electrode in the direction orthogonal to the longitudinal axis of the at least one vertical transistor.

22. The apparatus of claim 20, wherein a distance by which each gate electrode of the gate electrodes is recessed within the channel region relative to an outermost surface of the channel region is at least two-thirds of an overall width of the gate electrode in the direction orthogonal to the longitudinal axis of the at least one vertical transistor.

23. The apparatus of claim 20, wherein further portions of the second dielectric material directly horizontally intervene between adjacent gate electrodes, further portions of the second dielectric material abutting upper surfaces of the gate electrodes.

24. A memory array, comprising:
  memory cells, at least one memory cell of the memory cells comprising at least one vertical transistor, comprising:
    a channel region comprising an upper region and a lower region, a width of the lower region being less than a width of the upper region;
    gate electrodes laterally adjacent to the lower region of the channel region, at least a portion of the gate electrodes recessed below the upper region of the channel region;
    a gate dielectric material extending along an entirety of two sides of the gate electrodes, and along only a portion of upper ends of the gate electrodes proximal to the upper region of the channel region; and
    an insulative material laterally separating the gate electrodes of adjacent vertical transistors from one another, the insulative material abutting side surfaces of the gate dielectric material proximal to the upper ends of the gate electrodes and abutting additional side surfaces of the gate dielectric material proximal to lower ends of the gate electrodes; and
  a storage element in operative communication with the at least one vertical transistor.

25. A system, comprising:
  at least one input device;
  at least one output device;
  at least one processor device operably coupled to the at least one input device and the at least one output device; and
  an apparatus operably coupled to the at least one processor device, the apparatus comprising:
    an array of memory cells comprising vertical transistors, one or more of the vertical transistors comprising:
      a channel region comprising:
        an upper region exhibiting a first width; and
        a lower region extending downward from the upper region and exhibiting a second width, wherein the second width is smaller than the first width,
        wherein an interface between the upper region and the lower region defines at least one overhang portion;
      at least one gate electrode at least partially disposed vertically beneath the at least one overhang portion of the upper region of the channel region;
      a gate dielectric material between the at least one gate electrode and the at least one overhang portion of the upper region and between the at least one gate electrode and the lower region of the channel region, wherein a portion of the at least one gate electrode proximal to the at least one overhang portion of the upper region is free of gate dielectric material; and
      an insulative structure vertically separating the gate dielectric material from a conductive contact underlying the at least one gate electrode, outermost lateral boundaries of the gate dielectric material and the insulative structure substantially vertically aligned with one another.

* * * * *